US009761572B2

(12) United States Patent
Chen et al.

(10) Patent No.: US 9,761,572 B2
(45) Date of Patent: Sep. 12, 2017

(54) MEMORY DEVICE LAYOUT, SEMICONDUCTOR DEVICE, AND METHOD OF MANUFACTURING MEMORY DEVICE

(71) Applicant: TAIWAN SEMICONDUCTOR MANUFACTURING COMPANY, LTD., Hsinchu (TW)

(72) Inventors: Jui-Lin Chen, Taipei (TW); Feng-Ming Chang, Zhubei (TW); Huai-Ying Huang, Jhonghe (TW); Ping-Wei Wang, Hsin-chu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/688,321

(22) Filed: Apr. 16, 2015

(65) Prior Publication Data
US 2016/0307882 A1    Oct. 20, 2016

(51) Int. Cl.
*H01L 27/02* (2006.01)
*H01L 27/11* (2006.01)

(52) U.S. Cl.
CPC ...... *H01L 27/0207* (2013.01); *H01L 27/1104* (2013.01)

(58) Field of Classification Search
CPC .......................... H01L 27/0207; H01L 27/1104
See application file for complete search history.

(56) References Cited

U.S. PATENT DOCUMENTS

| 5,973,369 | A | * | 10/1999 | Hayashi | ................. H01L 21/84 257/369 |
|---|---|---|---|---|---|
| 8,421,205 | B2 | | 4/2013 | Yang | |
| 8,661,389 | B2 | | 2/2014 | Chern et al. | |
| 8,698,205 | B2 | | 4/2014 | Tzeng et al. | |
| 8,826,212 | B2 | | 9/2014 | Yeh et al. | |
| 8,836,141 | B2 | | 9/2014 | Chi et al. | |
| 8,976,573 | B2 | | 3/2015 | Liaw | |
| 2013/0272056 | A1 | | 10/2013 | Liaw | |
| 2014/0215420 | A1 | | 7/2014 | Lin et al. | |
| 2014/0264924 | A1 | | 9/2014 | Yu et al. | |
| 2014/0282289 | A1 | | 9/2014 | Hsu et al. | |
| 2014/0325466 | A1 | | 10/2014 | Ke et al. | |

FOREIGN PATENT DOCUMENTS

KR    10-2013-0115967    10/2013

* cited by examiner

*Primary Examiner* — Tran Tran
(74) *Attorney, Agent, or Firm* — Hauptman Ham, LLP

(57) ABSTRACT

A layout of a memory device is stored on a non-transitory computer-readable medium. The layout includes a plurality of active area regions, a lowermost interconnect layer, a plurality of memory cells, and a word line. The lowermost interconnect layer includes a first conductive layer over the plurality of active area regions, and a second conductive layer over the first conductive layer. The plurality of memory cells includes the plurality of active area regions. The word line is in the second conductive layer, and is coupled to the plurality of memory cells.

20 Claims, 12 Drawing Sheets

MEMORY DEVICE LAYOUT, SEMICONDUCTOR DEVICE, AND METHOD OF MANUFACTURING MEMORY DEVICE

BACKGROUND

The recent trend in miniaturizing integrated circuits (ICs) has resulted in smaller devices which consume less power, yet provide more functionality at higher speeds than before. The miniaturization process has also resulted in various developments in IC designs and/or manufacturing processes to ensure production yield and intended performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
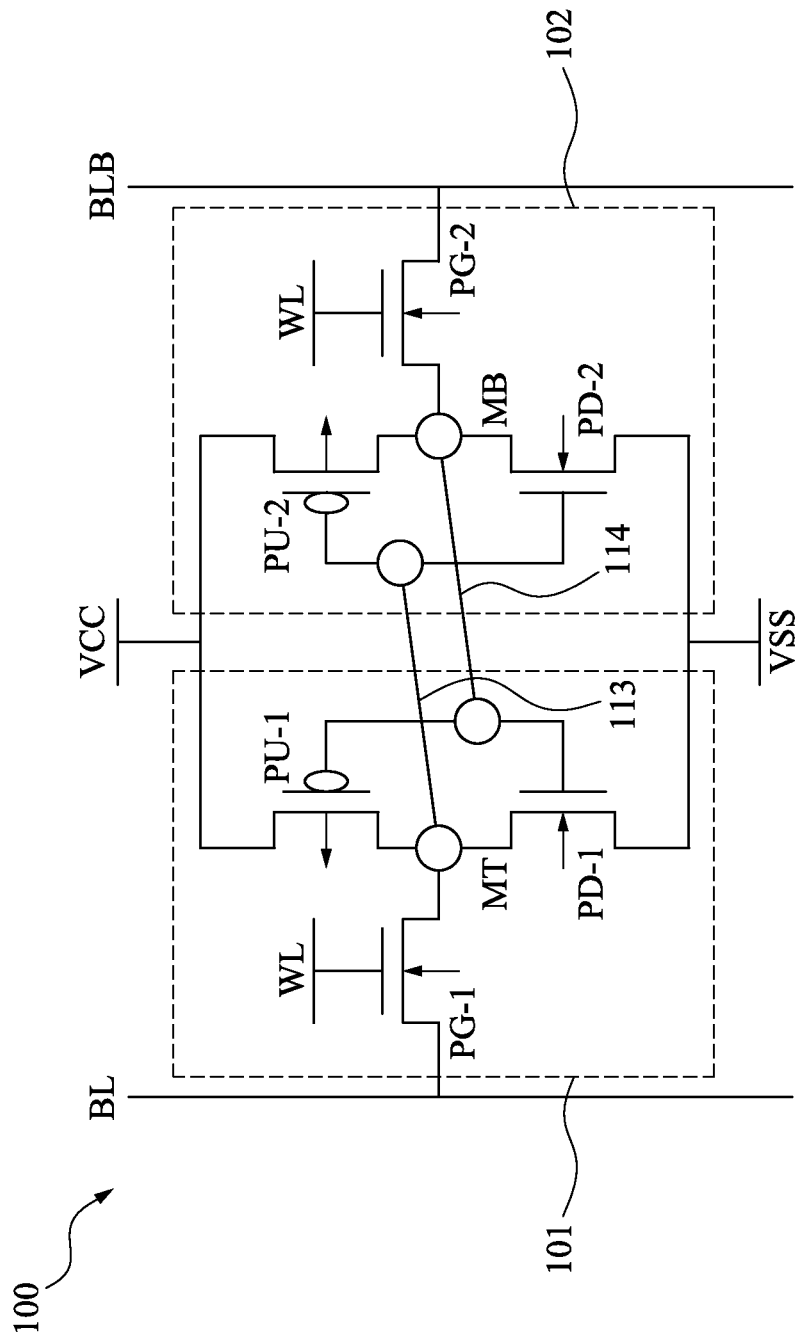
FIG. 1 is a schematic diagram of a memory cell, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

In some embodiments, an IC comprises a plurality of conductive interconnect layers, among which a lowermost conductive interconnect layer is referred to, in one or more embodiments, as a metal-zero (M0) layer. In some embodiments, the M0 layer comprises multiple layers, such as a lower layer MD1 and an upper layer MD2. In some embodiments, word lines of a memory device are formed in the MD2 layer. In at least one embodiment, by forming the word lines in the MD2 layer, it is possible to cover various manufacturing process windows with reduced cost and/or increased performance.

FIG. 1 is a schematic diagram of a memory cell 100, in accordance with one or more embodiments. The memory cell 100 comprises a first half 101 and a second half 102. In some embodiments, the first half 101 and the second half 102 are referred to as half-cells. The first half-cell 101 comprises a p-channel metal-oxide semiconductor (PMOS) transistor PU-1, an n-channel metal-oxide semiconductor (NMOS) transistor PD-1, and an NMOS transistor PG-1. The transistor PU-1 and the transistor PD-1 are cross-coupled to form a first cross-coupled inverter. The second half-cell 102 comprises a PMOS transistor PU-2, an NMOS transistor PD-2, and an NMOS transistor PG-2. The transistor PU-2 and the transistor PD-2 are cross-coupled to form a second cross-coupled inverter. The first and second cross-coupled inverters form a storage unit. In some embodiments, the transistors PU-1 and PU-2 are referred to as pull-up (PU) devices, the transistors PD-1 and PD-2 are referred to as pull-down (PD) devices, and the transistors PG-1 and PG-2 are referred to as pass-gate (PG) devices.

The sources of the transistors PU-1, PU-2 are electrically coupled to a first power supply node VCC. The drains of the transistors PU-1, PU-2 are electrically coupled to the drains of the corresponding transistors PD-1, PD-2 at corresponding first and second storage nodes MT and MB. A gate of the transistor PU-1 is electrically coupled to a gate of the transistor PD-1 and the drain of the transistor PD-2. A gate of the transistor PU-2 is electrically coupled to a gate of the transistor PD-2 and the drain of the transistor PD-1. The sources of the transistors PD-1 and PD-2 are electrically coupled to a second power supply node VSS. In some embodiments, a voltage at the second power supply node VSS corresponds to a ground voltage. The transistor PG-1 is coupled between a first bit line BL and the first storage node MT. A gate of the transistor PG-1 is coupled to a word line WL. The transistor PG-2 is coupled between a second bit line BLB and the second storage node MB. A gate of the transistor PG-2 is coupled to the word line WL. The transistor PG-1 and transistor PG-2 are configured to be activated based on a signal supplied by the word line WL to selectively connect the corresponding first and second cross-coupled inverters to the corresponding first and second bit lines BL, BLB. The first storage node MT is coupled to the gates of the transistor PU-2 and the transistor PD-2 by a connector 113. The second storage node MB is coupled to the gates of the transistor PU-1 and the transistor PD-1 by a connector 114.

In some embodiments, the memory cell 100 includes a number of transistors other than six. For example, in at least one embodiment, the memory cell 100 includes eight transistors. In some embodiments, the memory cell 100 is a single fin cell, e.g., the transistors PD-1, PD-2, PG-1, PG-2, PU-1 and PU-2 are single-fin FinFET transistors. In some embodiments, the memory cell 100 is a multiple-fin cell, e.g., the transistors PD-1, PD-2, PG-1, PG-2, PU-1 and PU-2 are multiple-fin FinFET transistors. In some embodiments, the transistors PD-1, PD-2, PG-1 and PG-2 in the memory cell 100 are multiple-fin FinFET transistors, and the transistors PU-1 and PU-2 are single-fin FinFET transistors. In some embodiments, the memory cell 100 is a portion of a random access memory (RAM) device, for example, a dynamic RAM (DRAM) memory chip or a static RAM (SRAM) memory chip.

Figure 2:
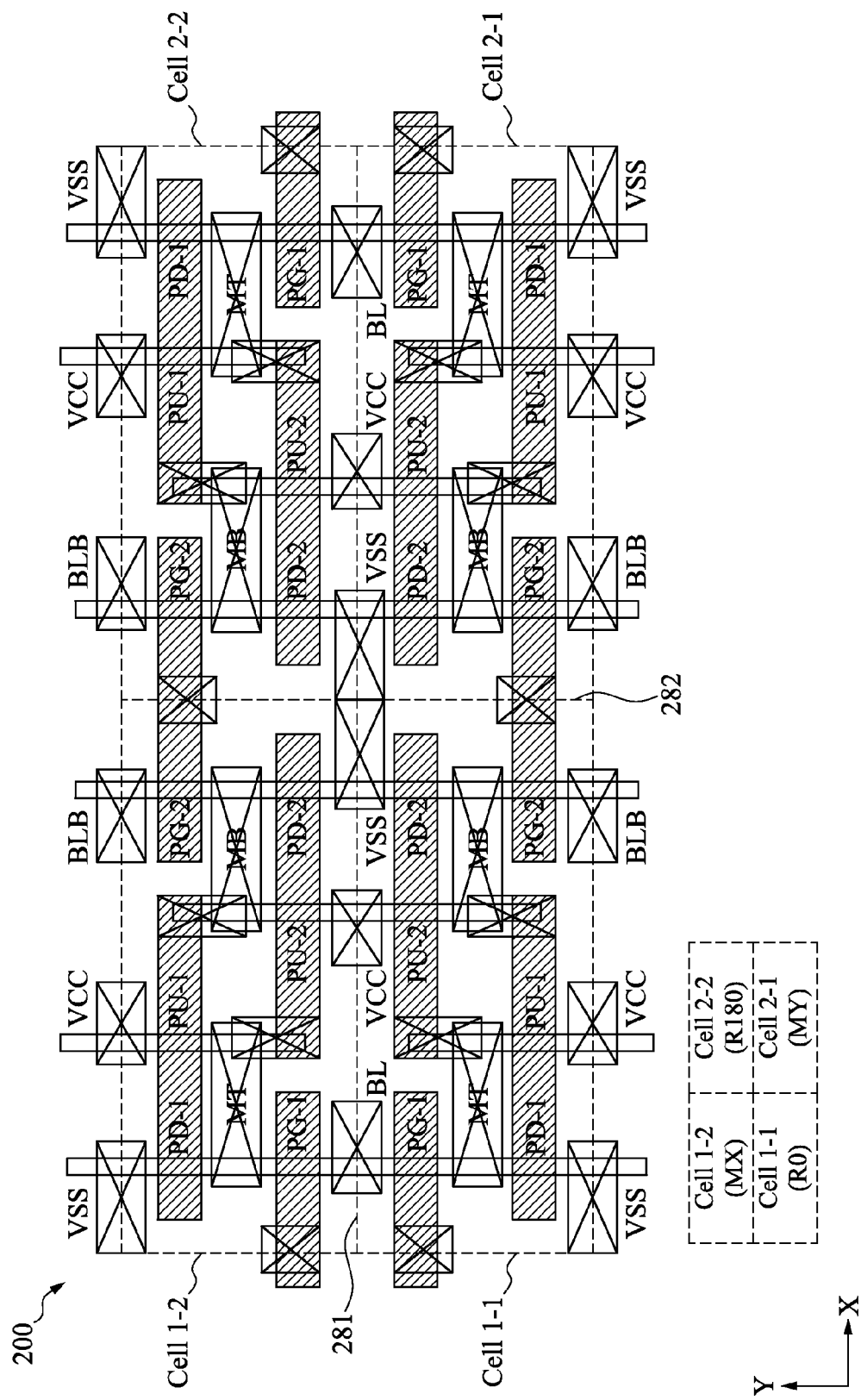
FIG. 2 is a top view of a layout of a portion of a memory device, in accordance with some embodiments.

FIG. 2 is a top view of a layout 200 of a 2×2 portion of a memory device, in accordance with some embodiments. The 2×2 portion of the memory device in the example configuration in FIG. 2 comprises a plurality of memory cells, for example, Cell 1-1, Cell 1-2, Cell 2-1, and Cell 2-2, arranged in an array along the X direction and the Y direction. In at least one embodiment, the layout of Cell 1-1 corresponds to a layout 300 described herein with respect to FIG. 3, and is designated in FIG. 2 as "R0." The designation "MX" indicates a layout symmetrical to the "R0" layout across the X direction. For example, the layout of Cell 1-2 is symmetrical to the layout of Cell 1-1 across a common edge 281 of Cell 1-1 and Cell 1-2, the common edge 281 is oriented in the X direction, and the layout of Cell 1-2 is designated in FIG. 2 as "MX." The designation "MY" indicates a layout symmetrical to the "R0" layout across the Y direction. For example, the layout of Cell 2-1 is symmetrical to the layout of Cell 1-1 across a common edge 282 of Cell 1-1 and Cell 2-1, the common edge 282 is oriented in the Y direction, and the layout of Cell 2- is designated in FIG. 2 as "MY." The designation "R180" indicates a layout symmetrical to the "MX" layout across the Y direction, or symmetrical to the "MY" layout across the X direction. For example, the layout of Cell 1-2 is symmetrical to the layout of Cell 1-2 across a common edge of Cell 1-2 and Cell 2-2, or is symmetrical to the layout of Cell 2-1 across a common edge of Cell 2-1 and Cell 2-2. The layout of Cell 2-2 is designated in FIG. 2 as "R180."

Figure 2A:
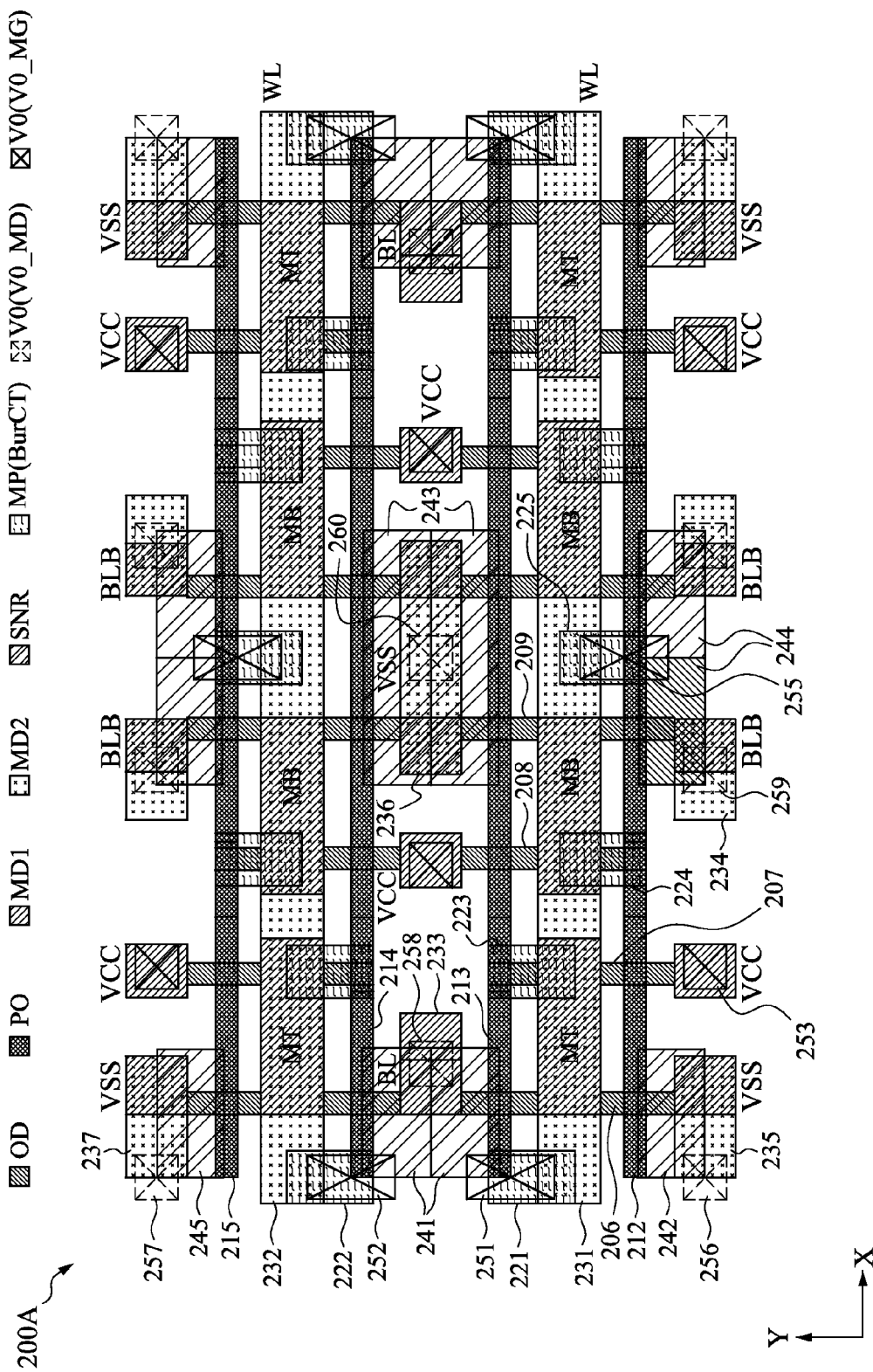
FIG. 2A is a top view of a layout of a portion of a memory device, in accordance with some embodiments.

FIG. 2A is a top view of a portion of a layout 200A of a memory device, in accordance with some embodiments. In some embodiments, the layout 200A corresponds to the layout 200 described with respect to FIG. 2, with the addition of an MD2 layer and a V0 layer. Layers OD, PO, MD1, MD2, MP and V0 in FIG. 2A are described in detail herein with respect to FIG. 5.

In the example configuration in FIG. 2A, there are four memory cells in the layout 200A, as described with respect to FIG. 2. The layout 200A comprises a plurality of active area regions extending in the Y direction as described with respect to FIG. 3. For example, active area regions 206, 207, 208, 209 are designated in FIG. 2A. In one or more embodiments, the active area regions 206, 207, 208, 209 in the layout 200A in FIG. 2A correspond to the active area regions 326, 327, 328, 329 in the layout 300 in FIG. 3. The active areas are referred to herein in one or more embodiments as oxide definition (OD) areas or patterns and are schematically illustrated in the drawings with the label "OD."

Figure 3:
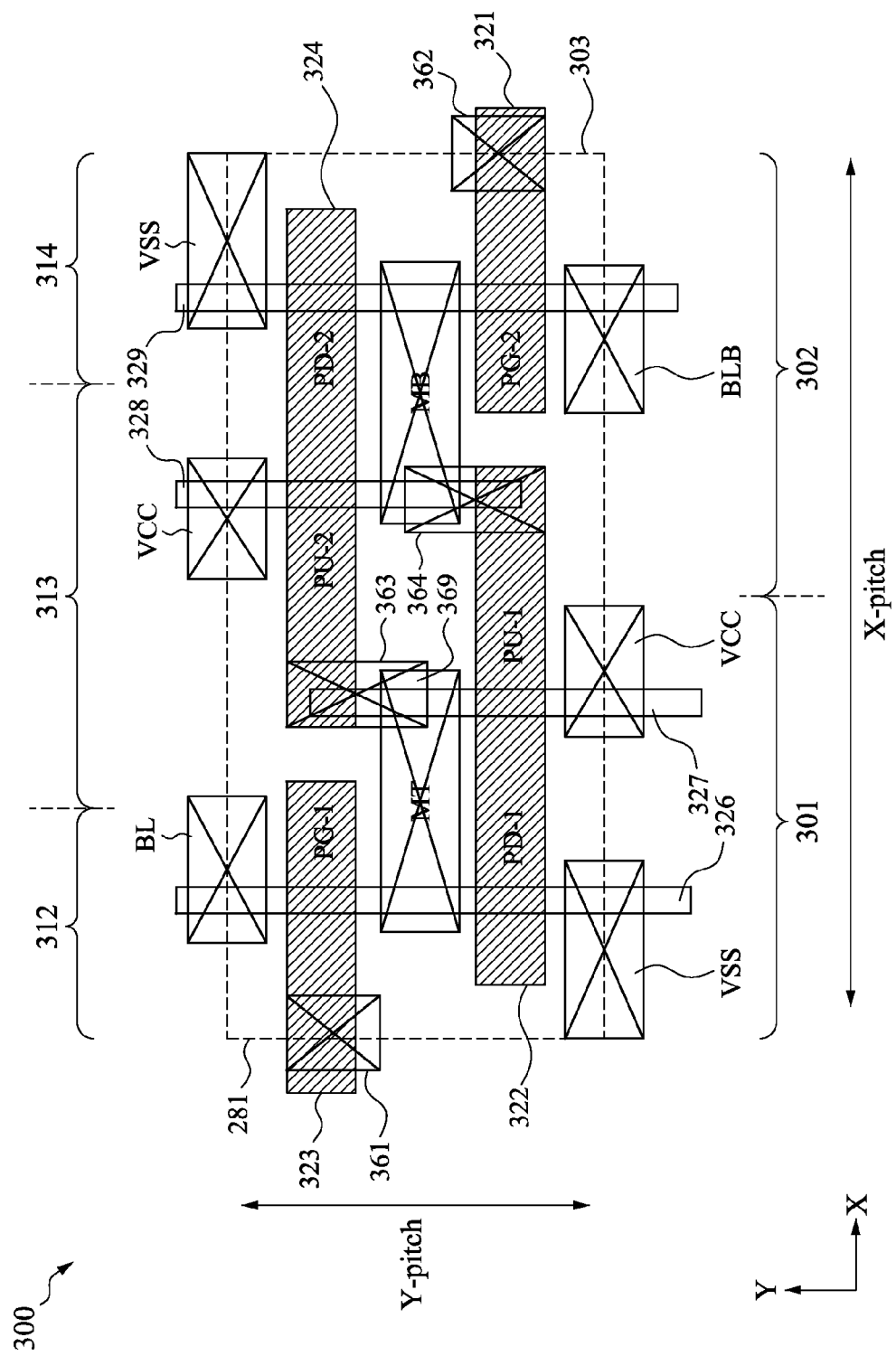
FIG. 3 is a top view of a layout of a memory cell, in accordance with some embodiments.

The layout 200A further comprises a plurality of gate electrodes extending in the X direction, over and crossing the active area regions as described with respect to FIG. 3. For example, gate electrodes 212, 213, 214, 215 are designated in FIG. 2A. Although the gate electrodes 212, 213, 214, 215 are illustrated in FIG. 2A as being continuous across multiple memory cells, each of the gate electrodes 212, 213, 214, 215 includes several discrete portions as described with respect to FIG. 3. In one or more embodiments, the gate electrodes 212, 213 in the layout 200A in FIG. 2A correspond to the gate electrodes 321/322 and 323/324 in the layout 300 in FIG. 3. The gate electrodes are referred to herein in one or more embodiments as poly (PO) patterns and are schematically illustrated in the drawings with the label "PO."

The layout 200A further comprises an MD1 layer. The MD1 layer comprises a plurality of conductive patterns corresponding to contact areas over the active area regions, and a plurality of conductive patterns corresponding to buried contacts over the gate electrodes as described with respect to FIG. 3. For example, contact areas BL, BLB, VCC, VSS, MT, MB, and buried contacts 221, 222, 223, 224, 225 are designated in FIG. 2A. The MD1 layer is schematically illustrated in the drawings with the label "MD1." The buried contacts are schematically illustrated in the drawings with the label "MP" or "BurCT." In one or more embodiments, the buried contacts 221, 223, 224, 225 in the layout 200A in FIG. 2A correspond to the buried contacts 361, 363, 364, 362 in the layout 300 in FIG. 3.

The layout 200A further comprises an MD2 layer over the MD1 layer. The MD2 layer is schematically illustrated in the drawings with the label "MD2." The MD2 layer comprises at least one word line coupled to a plurality of memory cells. For example, word lines 231, 232 are designated in FIG. 2A. The word lines are schematically illustrated in the drawings with the label "WL." In at least one embodiment, the word lines 231, 232 extend continuously across multiple corresponding memory cells. For example, the word line 231 extends continuously across, and is electrically coupled to, lower memory cells which correspond to Cell 1-1 and Cell 2-1 described with respect to FIG. 2. The word line 232 extends continuously across, and is electrically coupled to, upper memory cells which correspond to Cell 1-2 and Cell 2-2 described with respect to FIG. 2.

In the example configuration in FIG. 2A, the word lines 231, 232 extend over, while being electrically isolated from, the underlying storage nodes of the corresponding memory cells. For example, the word line 231 extends over, while being electrically isolated from, the storage nodes MT and MB of the corresponding lower memory cells. The word line 232 extends over, while being electrically isolated from, the storage nodes MT and MB of the corresponding upper memory cells. One or more example configurations is/are described herein with respect to FIGS. 6B-7B.

The word lines 231, 232 further extend over the buried contacts of the corresponding memory cells. For example, the word line 231 extends over, while being electrically isolated from, the buried contacts 223, 224 of the lower left memory cell which corresponds to Cell 1-1 described with respect to FIG. 2. One or more example configurations is/are described herein with respect to FIGS. 6B-7B.

The word line 231 further extends over buried contacts 221, 225, and is electrically coupled to the buried contacts 221, 225 of the lower left memory cell. Similarly, the word line 232 extends over the buried contact 222, and is electrically coupled to the buried contact 222. One or more example configurations is/are described herein with respect to FIGS. 6A-7A.

In at least one embodiment, a dielectric layer is interposed between the word lines 231, 232 and the underlying conductive patterns of the MD1 layer to electrically isolate the word lines 231, 232 from the underlying conductive patterns of the MD1 layer. In at least one embodiment, the dielectric layer is formed under the entire word lines 231, 232, including regions where the word lines 231, 232 extend over the buried contacts, e.g., 221, 222, 225, to which the word lines 231, 232 are electrically coupled. The word lines 231, 232 are electrically coupled to the corresponding buried contacts 221, 222, 225 from above as described herein. One or more example configurations is/are described herein with respect to FIGS. 6A-6B and 7A-7B.

In the example configuration in FIG. 2A, the word lines 231, 232 have about the same width, in the Y direction, as the underlying storage nodes MT, MB of the corresponding memory cells. This configuration is an example. Other arrangements are within the scope of various embodiments. For example, in one or more embodiments, the word lines 231, 232 have a width greater or less than that of the underlying storage nodes MT, MB. In the example configuration in FIG. 2A, the gate electrodes extend along, without overlapping, the word lines. For example, the gate electrodes 212, 213 extend alongside the word line 231, without overlapping the word line 231. The gate electrodes 214, 215 extend alongside the word line 232, without overlapping the word line 232.

In the example configuration in FIG. 2A, the MD2 layer further comprises conductive patterns extending over and electrically coupled to the underlying conductive patterns of the MD1 layer. For example, the MD2 layer further comprises, in addition to the word lines 231, 232, conductive patterns 233, 234, 235, 236, 237 extending over and electrically coupled to the corresponding underlying contact areas BL, BLB, VSS of the MD1 layer. In at least one embodiment, the dielectric layer interposed between the MD1 layer and the MD2 layer under the word lines 231, 232 is absent over the contact areas BL, BLB, VSS of the MD1 layer, and permits the corresponding conductive patterns 233, 234, 235, 236, 237 of the MD2 layer to be electrically coupled to the corresponding, underlying contact areas BL, BLB, VSS of the MD1 layer.

In at least one embodiment, the dielectric layer is absent in regions referred to herein as silicon-nitride-removal (SNR) regions which are schematically illustrated in the drawings with the label "SNR." For example, SNR regions 241, 242, 243, 244, 245 are designated in FIG. 2A. The overlapping conductive patterns of the MD1 layer and the MD2 layer are electrically coupled within the SNR regions. For example, the conductive pattern 233 of the MD2 layer is electrically coupled to the corresponding, underlying contact area BL of the MD1 layer in the SNR region 241. The conductive pattern 234 of the MD2 layer is electrically coupled to the corresponding, underlying contact area BLB of the MD1 layer in the SNR region 244. The conductive patterns 235, 236, 237 of the MD2 layer are electrically coupled to the corresponding, underlying contact areas VSS of the MD1 layer in the SNR regions 242, 243. Outside the SNR regions, overlapping conductive patterns of the MD1 layer and the MD2 layer are electrically isolated from each other by the dielectric layer. Example dielectric materials of the dielectric layer include, but are not limited to, silicon nitride, oxide, Al2Ox, and other suitable electrically insulating materials. Example methods for forming the dielectric layer between the MD1 layer and the MD2 layer in accordance with some embodiments are described herein with respect to FIGS. 6A-6B and 7A-7B.

The layout 200A further comprises a V0 layer over the MD2 layer. The layer V0, i.e., via-zero layer, is the lowermost via layer of the memory device. The V0 layer is schematically illustrated in the drawings with the label "V0." The V0 layer comprises a plurality of V0 vias over and electrically coupled to the corresponding, underlying conductive patterns of the MD1 layer or the MD2 layer. For example, V0 vias 251-260 are designated in FIG. 2A. In at least one embodiment, some of the V0 vias are electrically coupled to the MD1 layer whereas other V0 vias are electrically coupled to the MD2 layer. For example, the V0 vias 251-255 are electrically coupled to the corresponding, underlying conductive patterns of the MD1 layer, whereas the V0 vias 256-260 are electrically coupled to the corresponding, underlying conductive patterns of the MD2 layer.

In the example configuration in FIG. 2A, the V0 via 251 is over and electrically coupled to the buried contact 221 of the MD1 layer, the V0 via 252 is over and electrically coupled to the buried contact 222 of the MD1 layer, the V0 vias 253, 254 are over and electrically coupled to the corresponding, underlying contact areas VCC of the MD1 layer, and the V0 via 255 is over and electrically coupled to the buried contact 225 of the MD1 layer. The V0 via 251 is over and electrically coupled to the underlying word line 231. As a result, the gate electrode 213 is electrically coupled to the corresponding word line 231 via the buried contact 221 and the V0 via 251. The V0 via 252 is over and electrically coupled to the underlying word line 232. As a result, the gate electrode 214 is electrically coupled to the corresponding word line 232 through the buried contact 222 and the V0 via 252. The V0 via 255 is over and electrically coupled to the underlying word line 231. As a result, the gate electrode 212 is electrically coupled to the corresponding word line 231 through the buried contact 225 and the V0 via 255. The V0 vias 251-255 are schematically illustrated in the drawings with the label "V0_MG."

In the example configuration in FIG. 2A, the V0 vias 256, 257, 260 are over and electrically coupled to the corresponding, underlying conductive patterns 235, 237, 236 of the MD2 layer. As a result, the underlying contact areas VSS of the MD1 layer are electrically coupled to the corresponding V0 vias 256, 257, 260 through the corresponding conductive patterns 235, 237, 236 of the MD2 layer. The V0 vias 258, 259 are over and electrically coupled to the corresponding, underlying conductive patterns 233, 234 of the MD2 layer. As a result, the underlying contact areas BL, BLB of the MD1 layer are electrically coupled to the corresponding V0 vias 258, 259 through the corresponding conductive patterns 233, 234 of the MD2 layer. The V0 vias 256-260 are schematically illustrated in the drawings with the label "V0_MD."

In some embodiments, the layout 200A is represented by a plurality of masks generated by one or more processors and/or stored in one or more non-transitory computer-readable media. Other formats for representing the layout 200A are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 200A is presented by at least one mask corresponding to the active area regions 206, 207, 208, 209, at least one mask corresponding to the gate electrodes 212, 213, 214, 215, at least one mask corresponding to the spacers, at least one mask corresponding to the contact areas BL, BLB, VCC, VSS, MT, MB of the MD1 layer, at least one mask corresponding to the buried contacts 221, 222, 223, 224, 225 of an MP layer (described herein with respect to FIG. 5), at least one mask corresponding to the SNR regions, at least one mask corresponding to the word lines 231, 232 and the conductive patterns 233, 234, 235, 236, 237 of the MD2 layer, and at least one mask corresponding to V0 vias of the V0 layer.

In some embodiments, conductive patterns in one layer are manufactured by more than one mask. For example, the conductive patterns of the MD2 layer are manufactured, in one or more embodiments, by a first mask corresponding to the word lines 231, 232, and a second mask corresponding to the conductive patterns 233, 234, 235, 236, 237. In another example, the V0 vias of the V0 layer are manufactured, in one or more embodiments, by a first via mask corresponding to the V0 vias 251-255 which are electrically coupled to the corresponding, underlying conductive patterns of the MD1 or MP layer, and by a second via mask corresponding to the V0 vias 256-260 which are electrically coupled to the corresponding, underlying conductive patterns of the MD2 layer. In some embodiments, conductive patterns of more than one layer are manufactured by a common mask. For example, one or more buried contacts of the MP layer and one or more contact areas of the MD1 layer are manufactured by a common mask in one or more embodiments.

Figure 2B:
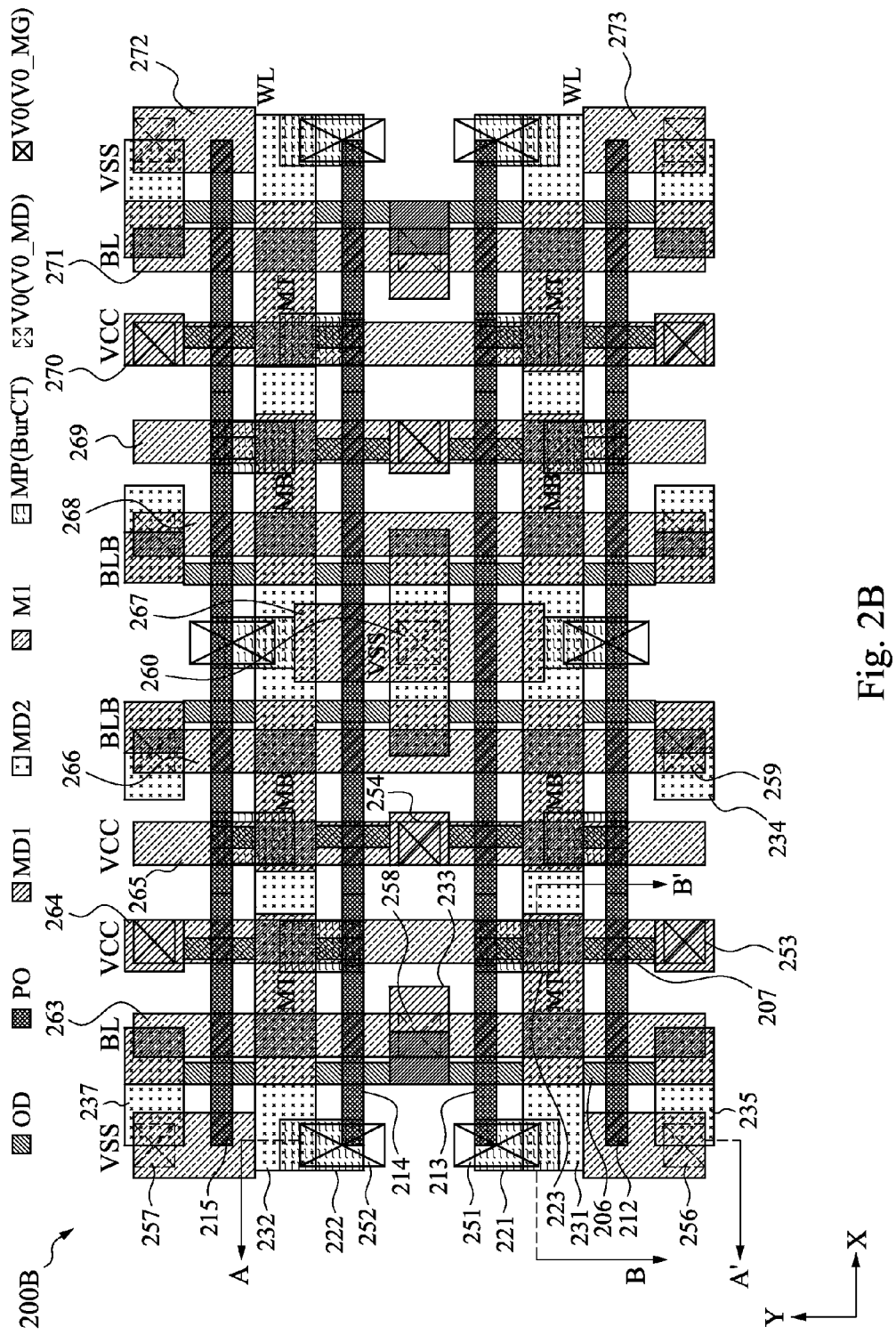
FIG. 2B is a top view of a layout of a portion of a memory device, in accordance with some embodiments.

FIG. 2B is a top view of a portion of a layout 200B of a memory device, in accordance with some embodiments. In some embodiments, the layout 200B corresponds to the layout 200A described with respect to FIG. 2A, with the addition of an M1 layer represented by at least one corresponding mask. The M1 layer in FIG. 2B is described in detail herein with respect to FIG. 5. For simplicity, the SNR regions are omitted from FIG. 2B.

The M1 layer comprises a plurality of conductive patterns corresponding to bit lines BL, BLB and power lines VCC, VSS, and electrically coupled to the corresponding underlying V0 vias. For example, the M1 layer comprises conductive patterns 261-273 among which the conductive patterns 261, 262, 267, 272, 273 correspond to power lines VSS, the conductive patterns 263, 271 correspond to bit lines BL, the conductive patterns 264, 265, 269, 270 correspond to power lines VCC, and the conductive patterns 266, 268 correspond to bit lines BLB.

The bit lines BL, BLB extend over and are electrically coupled with the corresponding, underlying V0 vias. For example, the bit line BL 263 extends over and is electrically coupled with the corresponding, underlying V0 via 258 which, in turn, is further electrically coupled, through the conductive pattern 233 of the MD2 layer and the corresponding, underlying contact area of the MD1 layer, to the active area region 206. In regions where the bit lines BL, BLB extend over underlying conductive patterns with no V0 via in between, the bit lines BL, BLB are not electrically coupled to the underlying conductive patterns. For example, in regions where the bit line BL 263 overlaps the gate electrodes 212-215, the word lines 231, 232, and the conductive patterns 235, 237 of the MD2 layer with no V0 via in between, the bit line BL 263 is not electrically coupled to the underlying gate electrodes 212-215, word lines 231, 232, and conductive patterns 235, 237.

The power lines VSS extend over and are electrically coupled with the corresponding, underlying V0 vias. For example, power lines VSS 261, 262 extend over and are electrically coupled with the corresponding, underlying V0 vias 256, 257 which, in turn, are further electrically coupled, through the corresponding conductive patterns 235, 237 of the MD2 layer and the corresponding, underlying contact areas of the MD1 layer, to the active area region 206. In regions where the power lines VSS extend over underlying conductive patterns with no V0 via in between, the power lines VSS are not electrically coupled to the underlying conductive patterns. For example, in a region where the power line VSS 261 overlaps the gate electrode 212 without a V0 via in between, the power line VSS 261 is not electrically coupled to the underlying gate electrode 212.

The power lines VCC extend over and are electrically coupled with the corresponding, underlying V0 vias. For example, power line VCC 264 extends over and is electrically coupled with the corresponding, underlying V0 via 253 which, in turn, is further electrically coupled, through the corresponding, underlying contact area of the MD1 layer without an intervening conductive pattern of the MD2 layer, to the active area region 207. In regions where the power lines VCC extend over underlying conductive patterns with no V0 via in between, the power lines VCC are not electrically coupled to the underlying conductive patterns. For example, in regions where the power line VCC 264 overlaps the gate electrodes 212-215, the word lines 231, 232, and the corresponding buried contacts of the gate electrodes 213, 214 with no V0 via in between, the power line VCC 264 is not electrically coupled to the underlying gate electrodes 212-215, word lines 231, 232, and buried contacts of the gate electrodes 213, 214.

In some embodiments, by forming the word lines WL in the MD2 layer, one or more advantages are achievable. Some other approaches include word lines in a metal layer higher than the M0 layer. For example, in some other approaches, the word lines are formed in the M1 layer and the bit lines are formed in an M2 layer (described herein with respect to FIG. 5). Compared to such other approaches, memory devices in accordance with some embodiments include the word lines in the MD2 layer of the M0 layer and the bit lines in the M1 layer. As a result, memory devices in accordance with some embodiments include a reduced number of interconnect or metal layers compared to some other approaches. The reduction of the number of interconnect or metal layers results, in some embodiments, in one or more effects including, but not limited to, reduced manufacturing cost, reduced memory device thickness, reduced word line capacitance with associated improved performance, and the like.

In some embodiments, by forming the word lines WL in the MD2 layer, one or more design challenges are resolvable. For example, in some other approaches where the word lines are not formed in the MD2 layer, there are one or more design considerations including, but not limited to, MD2 E-E process window, MD2 EN V0 process window, and M1 Min pitch process window. The MD2 E-E process window defines a minimal acceptable edge-to-edge spacing between adjacent MD2 conductive patterns of the MD2 layer. MD2 EN V0 process window defines a minimal acceptable spacing with which an MD2 conductive pattern encloses a V0 via landing on the MD2 conductive pattern. The M1 Min pitch process window defines a minimal acceptable pitch (e.g., center-to-center spacing) between adjacent M1 conductive patterns in the M1 layer. In some other approaches, the M1 layer not only includes the word lines but also provides electrical connections from the underlying memory cells to the overlying bit lines in the M2 layer. The density of M1 conductive patterns potentially limits the pitch and/or width of the M1 conductive patterns which, in turn, potentially limits the location of the corresponding V0 vias and/or MD2 conductive patterns. Such limitations on the location of the V0 vias and/or MD2 conductive patterns potentially make it difficult to meet the MD2 E-E process window and/or MD2 EN V0 process window which, if not met, potentially cause short circuits with reduced chip yield.

In some embodiments, by forming the word lines in the MD2 layer, the density of the M1 conductive patterns is reduced compared to some other approaches. As a result, limitations on the pitch and/or width of the M1 conductive patterns are relaxed. In the example configuration in FIG. 2B, it is possible to form the M1 conductive pattern 262 for VSS to be larger (i.e., wider in the X direction) than some other M1 conductive patterns, such as the M1 conductive patterns 263, 264, 265, 266. As a result, limitations on the location of the V0 via 257 electrically coupled to the M1 conductive pattern 262 are also relaxed which, in turn, permits relaxation of limitations on the location and/or size of the MD2 conductive pattern 237 electrically coupled to of the V0 via 257. Therefore, it is easier to meet one or some or all of MD2 E-E process window, MD2 EN V0 process window, and M1 Min pitch process window in at least one embodiment than in some other approaches, especially at high production nodes, such as node N10 or higher (10 nanometer or smaller). Because the process windows are met, chip yield is higher in at least one embodiment than in some other approaches.

In some embodiments, by forming the word lines WL in the MD2 layer, the manufacturing process and/or cost is reduced compared to some other approaches. As discussed herein, in some other approaches, it is potentially difficult to meet all of MD2 E-E process window, MD2 EN V0 process window, and M1 Min pitch process window. For example, in some other approaches, to meet the MD2 E-E process window, the MD2 layer is formed by at least one patterning process and at least one cutting process. The cutting process is to divide a continuous conductive pattern formed in the patterning process into multiple conductive patterns. At high production nodes, the numbers of patterning processes and/or cutting processes are increased which also increases the manufacturing cost. In some embodiments, the MD2 layer is formed by two patterning processes, without a cutting process. For example, as disclosed herein, the word lines are formed in a first patterning process using a first mask, and the remaining MD2 conductive patterns are formed in a second patterning process using a second mask. As a result, the cost and complexity of the processes for manufacturing the memory devices in accordance with some embodiments are reduced compared to some other approaches.

FIG. 3 is a top view of a layout 300 of a memory cell, in accordance with some embodiments. A dimension of the memory cell in a first direction, i.e., the X direction, is referred to as "X-pitch," and a dimension of the memory cell in a second direction, i.e., the Y direction, is referred to as "Y-pitch." In the example configuration in FIG. 3, the Y-pitch is shorter than the X-pitch. In at least one embodiment, the memory cell having the layout 300 corresponds to the memory cell 100, and includes a first half-cell 301 and a second half-cell 302. An imaginary boundary 303 of the memory cell 100 is illustrated in FIG. 3. In the example configuration in FIG. 3, the first half-cell 301 corresponds to the first half-cell 101 of the memory cell 100, and the second half-cell 302 corresponds to the second half-cell 102 of the memory cell 100. In at least one embodiment, the first half-cell 301 is symmetrical to the second half-cell 302 across the center point of the memory cell 100.

The memory cell 100 is configured over a plurality of well regions. In the example configuration in FIG. 3, the memory cell 100 is configured over well regions 312, 313 and 314. In at least one embodiment, the well regions 312 and 314 are p-well regions, and the well region 313 is an n-well region. The described conductivity of the well regions 312, 313 and 314 is an example. Other arrangements are within the scope of various embodiments. The well regions 312, 313 and 314 are configured for different types of devices or transistors. In the example configuration in FIG. 3, the n-well region 313 is a region for forming PMOS transistors, and the p-well regions 312, 314 are regions for forming NMOS transistors.

The memory cell 100 includes a plurality of active area regions 326, 327, 328, 329 over the well regions 312, 313 and 314. The active area regions 326, 327, 328, 329 extend along the Y direction. Example materials of the active area regions 326, 327, 328, 329 include, but are not limited to, semiconductor materials doped with various types of p-type dopants and/or n-type dopants. Example p-type dopants include, but are not limited to, boron and BF2. Example n-type dopants include, but are not limited to, phosphorus and arsenic. The active area regions 326, 327, 328, 329 are isolated from each other by one or more isolation structures as described herein. The active area regions 326, 327, 328, 329 are within corresponding well regions. For example, the active area region 326 is within the p-well region 312, the active area regions 327, 328 are within the n-well region 313, and the active area region 329 is within the p-well region 314. In the example configuration in FIG. 3, each of the active area regions 326, 327, 328, 329 comprises a fin. The described configuration is a single-fin configuration and is an example. Other arrangements with different numbers of fins per active area region are within the scope of various embodiments. For example, in one or more embodiments, the active area regions 326, 327, 328, 329 do not include fins and are configured for forming planar MOSFET transistors.

The memory cell 100 further comprises a plurality of gate electrodes. The gate electrodes 321, 322, 323, 324 extend along the X direction, across the active area regions 326, 327, 328, 329. Example materials of the gate electrodes 321, 322, 323, 324 include, but are not limited to, polysilicon and metal. Other materials are within the scope of various embodiments. In the example configuration in FIG. 3, two gate electrodes are arranged in each of the half-cells 301, 302. For example, gate electrodes 322, 323 are arranged in the first half-cell 301, and gate electrodes 321, 324 are arranged in the second half-cell 302.

The gate electrodes 321, 322, 323, 324 and the corresponding active area regions 326, 327, 328, 329 form one or more transistors in the layout 300. In the example configuration in FIG. 3, the transistors PD-1, PD-2, PG-1, PG-2, PU-1 and PU-2 of the memory cell 100 are configured by the corresponding active area regions 326, 327, 328, 329, and the corresponding gate electrodes 321, 322, 323, 324. For example, the transistor PG-1 comprises a gate configured by the gate electrode 323, and source/drains configured by portions of the fin 326 on opposite sides of the gate electrode 323. For simplicity, the transistors of the memory cell 100 are designated in FIG. 3 at the intersections of the corresponding fins and the corresponding gate electrodes. For example, the transistor PD-1 is designated by reference numeral "PD-1" at an intersection of the corresponding gate electrode 322 and the corresponding fin 326. The NMOS transistors PD-1 and PG-1 are configured over the p-well region 312, the NMOS transistors PD-2 and PG-2 are configured over the p-well region 314, and the PMOS transistors PU-1 and PU-2 are configured over the n-well region 313. In at least one embodiment, one or more of the transistors PD-1, PD-2, PG-1, PG-2, PU-1 and PU-2 correspond to one or more of the transistors described with respect to FIG. 1.

The memory cell 100 further comprises a plurality of spacers associated with the corresponding gate electrodes. For simplicity, the spacers are not illustrated in FIG. 3. The spacers extend along longitudinal sides of the corresponding gate electrodes in the X direction. The spacers include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers have a tapered profile.

The memory cell 100 further comprises a plurality of contact areas over the corresponding active area regions 326, 327, 328, 329, for electrically coupling the corresponding source/drains of the transistors PD-1, PD-2, PG-1, PG-2, PU-1 and PU-2 with each other or with other circuitry. The contact areas are also referred to herein as "S/D contacts." For simplicity, the contact areas of the memory cell 100 are designated by the corresponding nodes or lines to which the contact areas are coupled. For example, the contact area coupling the transistor PG-1 to the first bit line BL is designated as "BL," the contact area coupling the transistor PG-2 to the second bit line BLB is designated as "BLB," the contact areas coupling the transistor PU-1 and the transistor PU-2 to the power supply node VCC are designated as "VCC," the contact areas coupling the transistor PD-1 and the transistor PD-2 to the power supply node VSS are designated as "VSS," the contact area coupling the drains of the transistors PU-1, PD-1 and PG-1 corresponds to the storage node MT and is designated as "MT," and the contact area coupling the drains of the transistors PU-2, PD-2 and PG-2 corresponds to the storage node MB and is designated as "MB." In some embodiments, the contact areas BL, BLB, VCC, VSS, MT and MB include conductive portions or conductive patterns in the MD1 layer.

The memory cell 100 further comprises a plurality of buried contacts. In the example configuration in FIG. 3, the memory cell 100 comprises buried contacts 361, 362, 363, 364, which are also referred to herein as "gate contacts." The buried contacts 361, 362 are over and electrically coupled to the corresponding gate electrodes 323, 321. Vias of the V0 layer (referred to herein as "V0 vias") are over and electrically coupled to the gate contacts 361, 362 as described herein. The gate of the transistor PG-1 is electrically coupled to a corresponding word line via the corresponding gate contact 361 and the corresponding V0 via, and the gate of the transistor PG-2 is electrically coupled to the corresponding word line via the corresponding gate contact 362 and the corresponding V0 via. For simplicity, the word line and the V0 vias are not illustrated in FIG. 3. The word line and the corresponding V0 vias in accordance with some embodiments are described herein with respect to FIGS. 2A-2B, 4, 6A-6B and 7A-7B.

The buried contact 363 is over the gate electrode 324 and the contact area MT, and electrically couples the contact area MT to the gate electrode 324. The buried contact 364 is over the gate electrode 322 and the contact area MB, and electrically couples the contact area MB to the gate electrode 324. In at least one embodiment, the buried contacts 363, 364 correspond to the connectors 113, 114 of the memory cell 100 described with respect to FIG. 1. In at least one embodiment, the buried contacts 363, 364 are internal to the memory cell 100, and are not electrically coupled to other elements of a memory device comprising the memory cell 100. In some embodiments, the buried contacts 361, 362, 363, 364 include conductive portions or conductive patterns in the MP layer. In at least one embodiment, the buried contacts 361, 362, 363, 364 include conductive portions or conductive patterns in the MD1 layer. For example, in a region 369 of the layout 300, although the contact area MT and the buried contact 363 are illustrated as overlapping each other, the contact area MT and the buried contact 363 belong to the same MD1 layer in one or more embodiments.

As discussed herein, conductive patterns in one layer are manufactured by one or more masks. For example, in at least one embodiment, the conductive patterns of the M1 layer are manufactured by one mask, as illustrated in the example configuration in FIG. 2B. Other arrangements are within the scope of various embodiments. For example, in an example configuration described with respect to FIG. 4, the conductive patterns of the M1 layer are manufactured by two masks.

Figure 4:
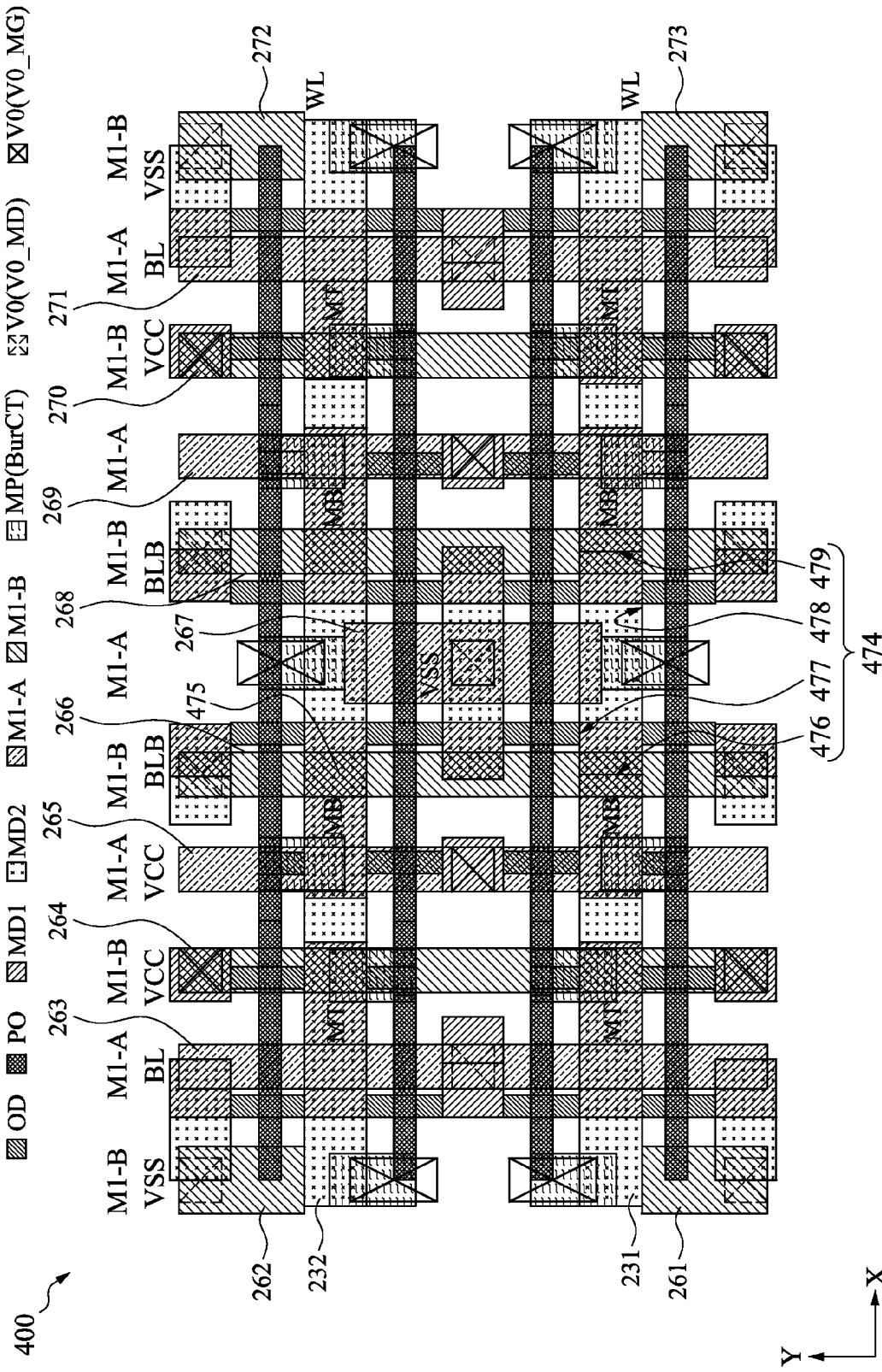
FIG. 4 is a top view of a layout of a portion of a memory device, in accordance with some embodiments.

FIG. 4 is a top view of a portion of a layout 400 of a memory device, in accordance with some embodiments. In some embodiments, the layout 400 corresponds to the layout 200B described with respect to FIG. 2B, with a difference being that the M1 layer includes two masks M1-A and M1-B. The mask M1-A includes conductive patterns 263, 265, 267, 269, 271 which are schematically illustrated in the drawing with the label "M1-A." The mask M1-B includes conductive patterns 261, 262, 264, 266, 268, 270, 272, 273 which are schematically illustrated in the drawings with the label "M1-B." The conductive patterns of the mask M1-A and the conductive patterns of the mask M1-B are arranged alternatingly in the X direction. In at least one embodiment, by forming the conductive patterns of the M1 layer with two masks as described herein, it is possible to form the conductive patterns of the M1 layer at a density higher than a limitation of lithography processes used for manufacturing the M1 layer.

In the example configuration in FIG. 4, the layout 400 further comprises Cut-M1 regions 474, 475. The Cut-M1 region 474 extends, over the word line 231, from the M1 conductive pattern 266 to the M1 conductive pattern 268 and includes edges 476, 477, 478, 479. The Cut-M1 region 475 is configured similarly and extends, over the word line 232, from the M1 conductive pattern 266 to the M1 conductive pattern 268. The Cut-M1 regions are for removing the line-ends of the M1 conductive pattern 267 to prevent potential bridging contacts between the M1 conductive pattern 267 and the adjacent V0_MG vias, e.g., the V0 via 255 designated in FIG. 2A. In some embodiments, the Cut-M1 regions are omitted.

Figure 5:
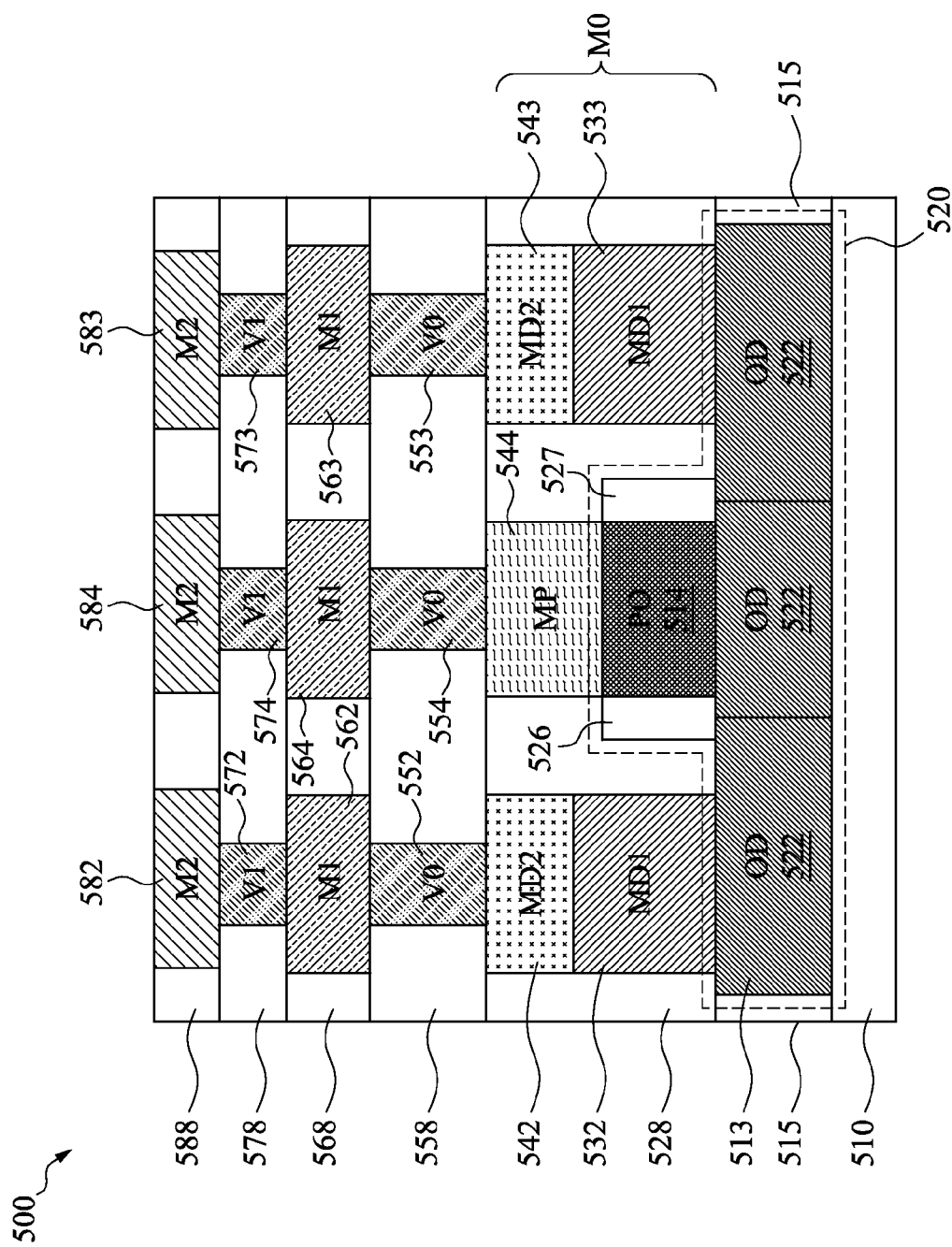
FIG. 5 is a schematic cross-sectional view of a semiconductor device, in accordance with some embodiments.

FIG. 5 is a schematic cross-sectional view of a semiconductor device 500, in accordance with some embodiments. The semiconductor device 500 includes a semiconductor substrate 510, and a plurality of elements. An example element 520 is illustrated in FIG. 5.

The semiconductor substrate 510 includes, but is not limited to, bulk silicon, a semiconductor wafer, a silicon-on-insulator (SOI) substrate, or a silicon germanium substrate. Other semiconductor materials including group III, group IV, and group V elements are within the scope of various embodiments.

The elements of the semiconductor device 500 include active elements and/or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), Fin-FETs, and planar MOS transistors with raised sources and drains. Examples of passive elements include, but are not limited to, capacitors, inductors, fuses, and resistors. In the example configuration illustrated in FIG. 5, the element 520 is a transistor. Therefore, in the present disclosure, element 520 is also referred to as a transistor 520.

In some embodiments, semiconductor device 500 corresponds to a memory circuit as described in conjunction with one or more of FIGS. 1-4. In some embodiments, transistor 520 corresponds to the implementation of one or more of transistors PD-1, PD-2, PG-1, PG-2, PU-1 and PU-2 as described in conjunction with FIG. 1 and further illustrated and/or described in conjunction with one or more of FIGS. 2-4.

The transistor 520 includes an active area 513 over the substrate 510, and a gate structure 514 over the active area 513. The active area 513 is isolated from other elements of the semiconductor device 500 by one or more one or more isolation structures 515 also formed over the substrate 510. The active area 513 is referred to herein as an oxide definition (OD) area or pattern and is schematically illustrated in the drawings with the label "OD." The active area 513 is a doped area and includes a source region 522, a drain region 523, and a channel region 524 between the source region 522 and drain region 523. Examples of materials of the active area 513 include, but are not limited to, semiconductor materials doped with various types of p-dopants and/or n-dopants.

The gate structure 514 is over the channel region 524. The gate structure 514 is referred to herein as a poly (PO) pattern and is schematically illustrated in the drawings with the label "PO." Examples of materials of the gate structure 514 include, but are not limited to, metal and polysilicon. The source region 522, the drain region 523, the channel region 524 and the gate structure 514 together define the transistor 520. In at least one embodiment, spacers 526, 527 are formed on opposite sides of the gate structure 514. A dielectric layer 528 is over the transistor 520 and the spacers 526, 527.

Conductive patterns are formed over the transistor 520 to provide electrical connections to the transistor 520. In the example configuration in FIG. 5, conductive segments 532, 533, 542, 543 and 544 are formed in the dielectric layer 528 to provide electrical connection to the gate structure 514, the source region 522 and the drain region 523. The conductive segments 532, 533 are over and electrically coupled to the corresponding source region 522 and drain region 523, and belong to a lower conductive layer referred to herein as MD1 layer or pattern. The MD1 layer is a metal-zero-over-oxide layer and is schematically illustrated in the drawings with the label "MD1." The conductive segments 542, 543 are formed over and electrically coupled to the corresponding conductive segments 532, 533, and belong to an upper conductive layer referred to herein as MD2 layer or pattern. The MD2 layer is also a metal-zero-over-oxide layer and is schematically illustrated in the drawings with the label "MD2." In at least one embodiment, at least one of the conductive segments 542, 543 is in direct electrical contact with the corresponding conductive segment 532 or 533.

The conductive segment 544 is formed over and electrically coupled to the gate structure 514. The conductive segment 544 is referred to herein as a metal-zero-over-polysilicon (MP) layer or pattern and is schematically illustrated in the drawings with the label "MP." In at least one embodiment, the conductive segment 544 is in direct electrical contact with the gate structure 514.

The MP, MD1 and MD2 layers comprise a conductive material and belong to a first (i.e., lowermost) conductive interconnect layer above the elements formed over the substrate 510. In at least one embodiment, the MP, MD1 and MD2 layers comprise a metal and belong to a first metal layer, referred to herein as "M0 layer," i.e., metal-zero (M0) layer, which is the lowermost metal layer of the semiconductor device 500. The M0 layer is schematically illustrated in the drawings with the label "M0." In at least one embodiment, the M0 layer is formed in two steps. For example, in a first step, the lower portion, i.e., the MD1 layer, is formed to be at least partially co-elevational with the gate structure 514 so that at least a portion of the MD1 layer is at the same level as at least a portion of the MD2 layer. In a second step, the upper portion, i.e., the MD2 layer and the MP layer, is formed over the corresponding MD1 layer and gate structure 514. The described configurations of the MD1, MD2 and MP layers are examples. Other configurations are within the scope of various embodiments. For example, in one or more embodiments, the MP layer is formed together with the MD1 layer, e.g., as a part of the MD1 layer. In one or more embodiments, the MP layer is formed together with the MD2 layer, e.g., as a part of the MD2 layer. In one or more embodiments, the MP layer is formed in one or more processes separate from those for forming the MD1 layer and the MD2 layer.

A dielectric layer 558 is over the dielectric layer 528. One or more vias 552, 553 and 554 are in the dielectric layer 558 to provide electrical connections to the MP and MD2 layers, and then to the transistor 520 via the corresponding gate structure 514 and MD1 layer. For example, the via 552 is in the dielectric layer 558 to provide electrical connection to the underlying conductive segment 542 of the MD2 layer, which is further electrically coupled to the source region 522 via the conductive segment 532 of the MD1 layer. The vias 552, 553 and 554 belong to a via layer V0, i.e., via-zero layer, which is the lowermost via layer of the semiconductor device 500. The V0 layer is schematically illustrated in the drawings with the label "V0." In at least one embodiment, at least one of the vias 552, 553 and 554 is in direct electrical contact with the corresponding conductive segments 542, 543 or 544.

A dielectric layer 568 is over the dielectric layer 558. One or more conductive segments 562, 563 and 564 are in the dielectric layer 568 to provide electrical connections to the corresponding vias 552, 553 and 554. The conductive segments 562, 563 and 564 belong to a second metal layer M1, which is the second lowermost metal layer above the elements formed over the substrate 510 of the semiconductor device 500. The M1 layer is schematically illustrated in the drawings with the label "M1." The described configurations of the M0, V0 and M1 layers are examples. Other configurations are within the scope of various embodiments. For example, in some embodiments, the MD2 layer is omitted in at least one region of the semiconductor device 500, and, in this at least one region of the semiconductor device 500, the V0 layer is electrically connected between the M1 layer and the MD1 layer. In some embodiments, the MP layer is omitted in at least one region of the semiconductor device 500 and, in this at least one region of the semiconductor device 500, the V0 layer is electrically connected between the M1 layer and the corresponding PO pattern(s).

A dielectric layer 578 is over the dielectric layer 568. One or more vias 572, 573, and 574 are in the dielectric layer 578 to provide electrical connections to the corresponding conductive segments 562, 563 and 564. The vias 572, 573, and 574 belong to a via layer V1 schematically illustrated in the drawings with the label "V1."

A dielectric layer 588 is over the dielectric layer 578. One or more conductive segments 582, 583 and 584 are in the dielectric layer 588 to provide electrical connections to the corresponding vias 572, 573 and 574. The conductive segments 582, 583 and 584 belong to a metal layer M2 schematically illustrated in the drawings with the label "M2."

At least one of the M1 and M2 layers and at least one of the V0 and V1 layers provide electrical connections between various elements of the semiconductor device 500 and/or between one or more elements of the semiconductor device 500 and external circuitry. The above-described structure is an example configuration, and other arrangements of electrical connections among elements of the semiconductor device 500 are contemplated in various embodiments. For example, in one or more embodiments, one or more further metal layers, e.g., a M3 layer and up, are formed over the M2 layer. The metal layers are connected with each other by one or more via layers, e.g., a via layer V2 and up, each interposed between a pair of adjacent metal layers.

A semiconductor device in accordance with some embodiments comprises a memory device which, in turn, comprises a plurality of memory cells coupled to a plurality of bit lines and word lines.

Figure 6A:
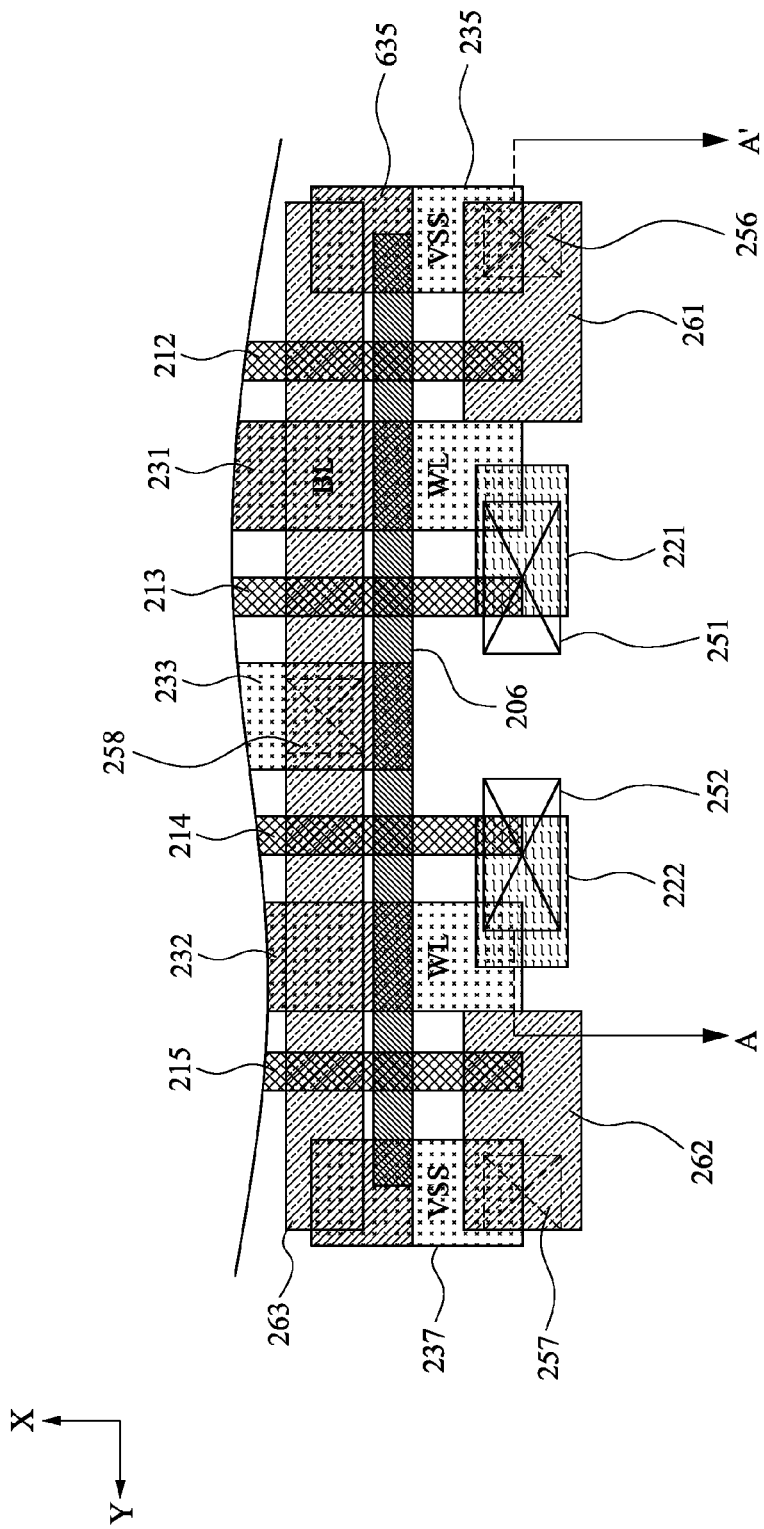
FIG. 6A is an enlarged view of a region around line A-A' on a left side of the layout in FIG. 2B, in accordance with some embodiments.
Figure 6B:
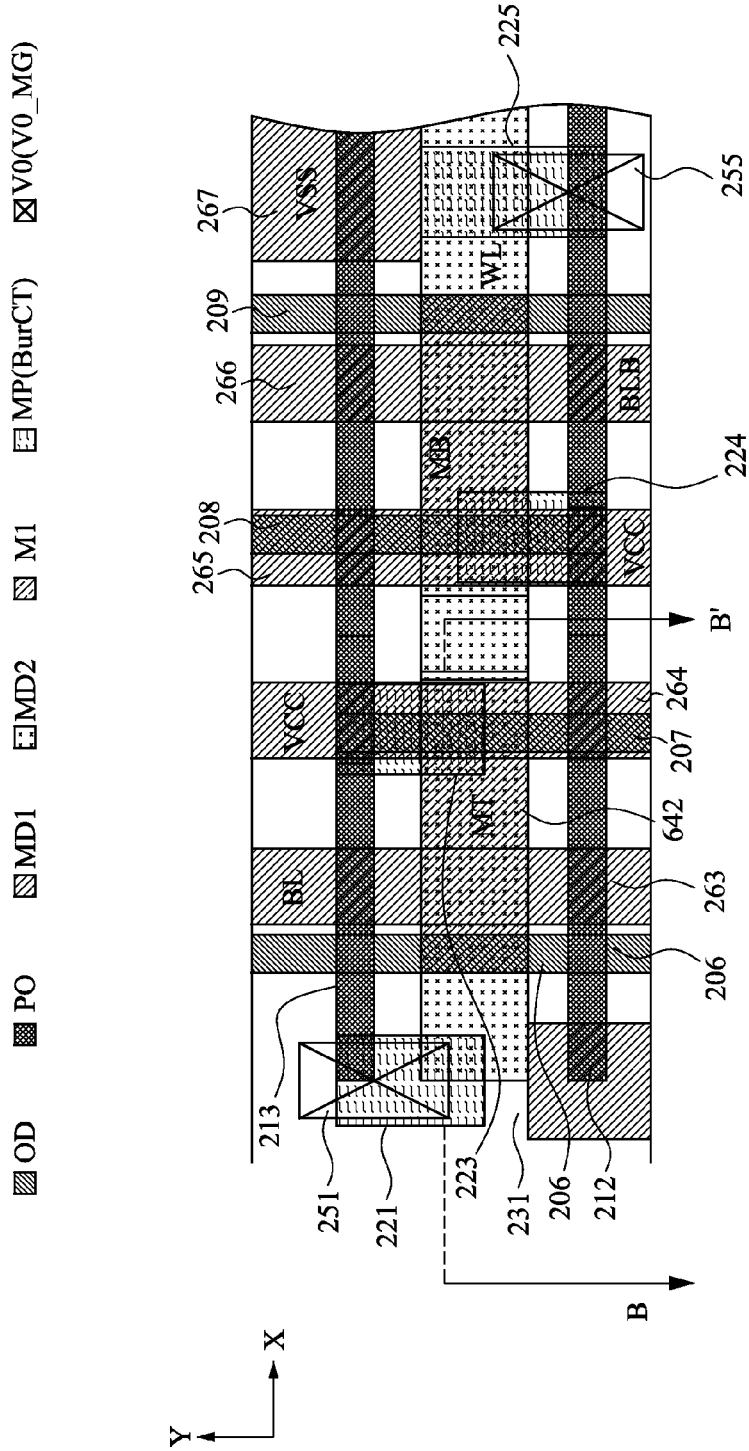
FIG. 6B is an enlarged view of a region around line B-B' at a lower, left corner of the layout in FIG. 2B, in accordance with some embodiments.
Figure 7A:
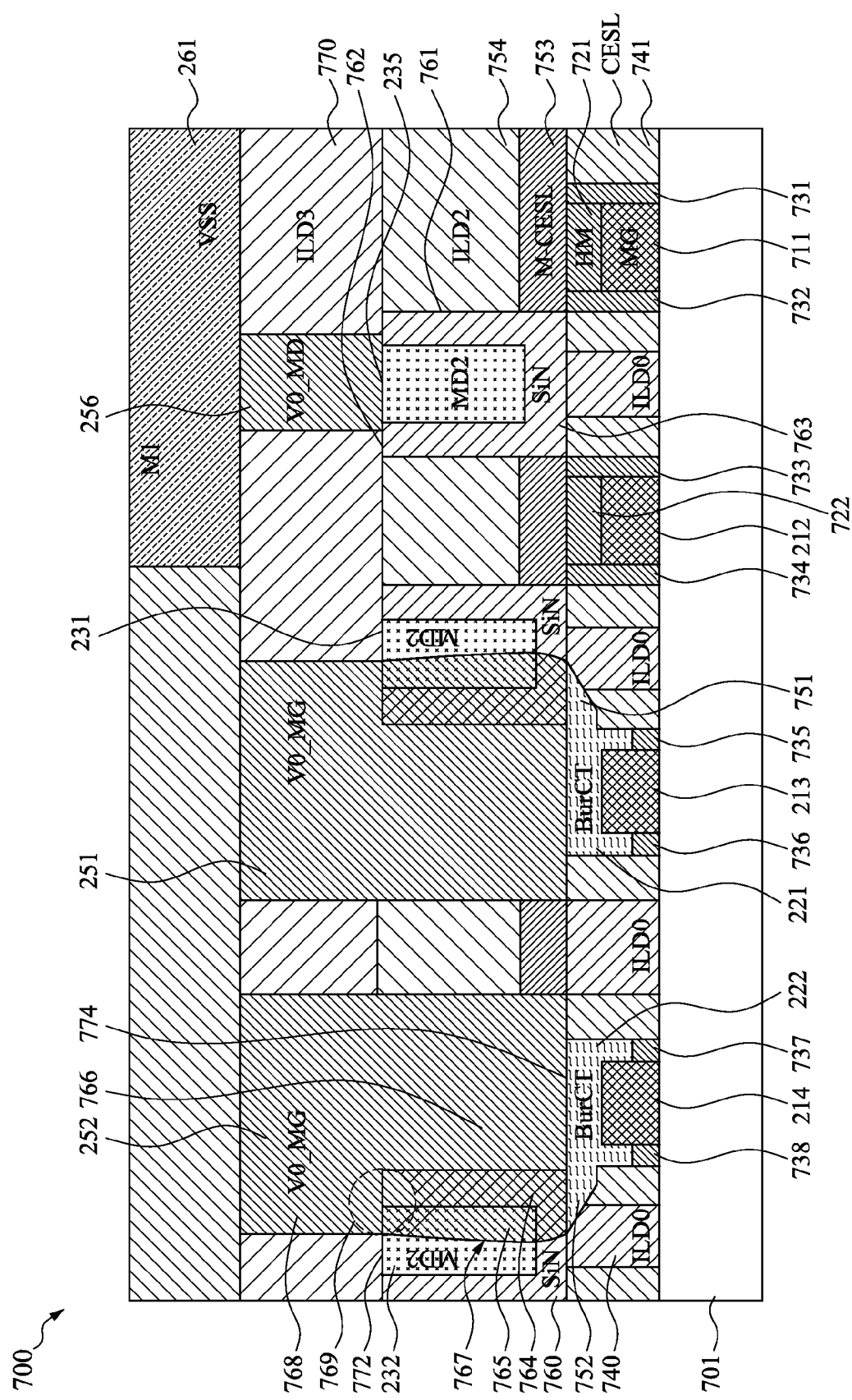
FIG. 7A is a cross-section view of a memory device taken along line A-A' in FIG. 2B or FIG. 6A, in accordance with some embodiments.
Figure 7B:
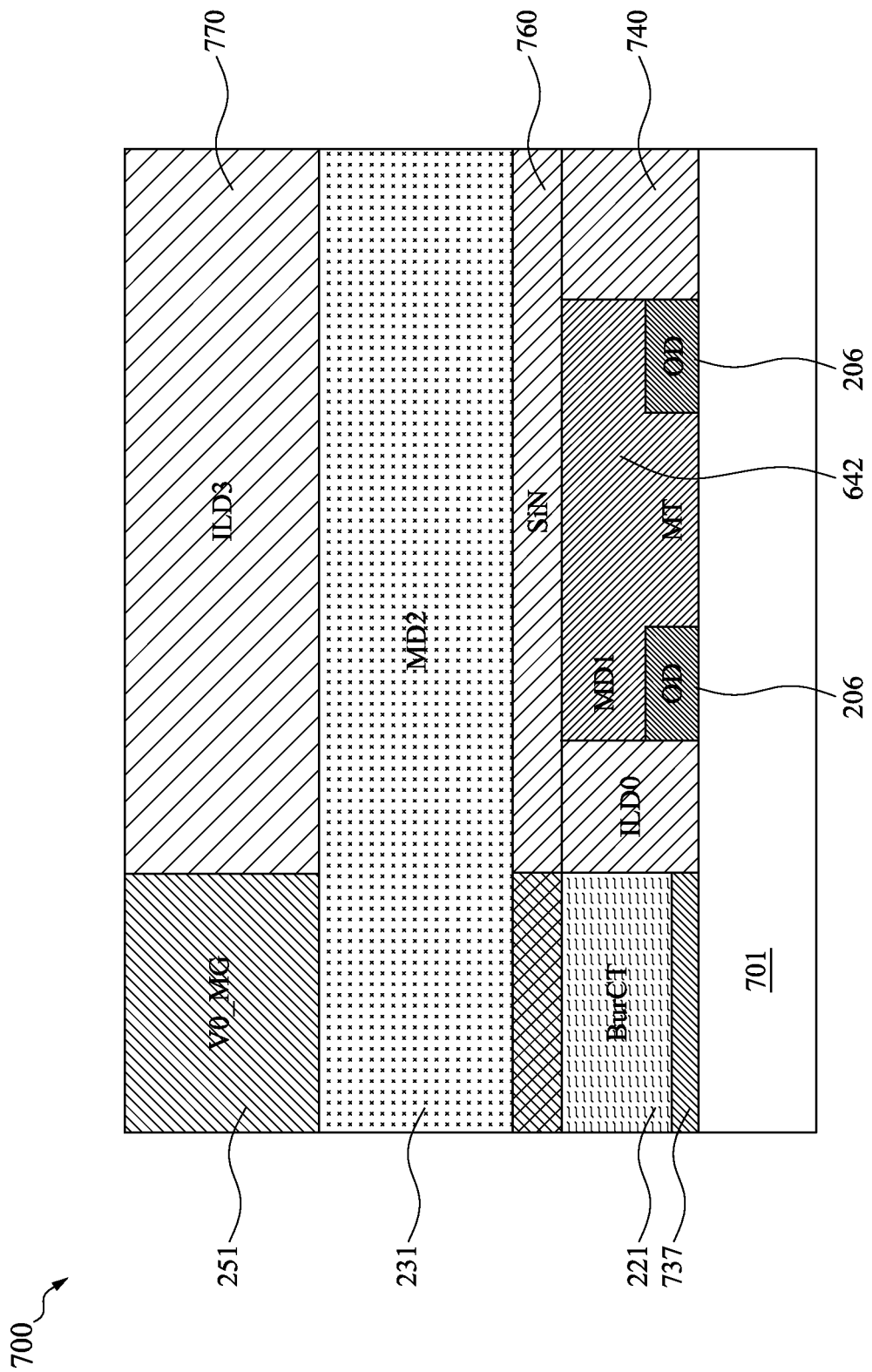
FIG. 7B is a cross-section view of a memory device taken along line B-B' in FIG. 2B or FIG. 6B, in accordance with some embodiments.

FIG. 6A is an enlarged view of a region around line A-A' on a left side of the layout 200B in FIG. 2B, and FIG. 7A is a cross-section view of a memory device 700 taken along line A-A' in FIG. 6A, in accordance with some embodiments. FIG. 6B is an enlarged view of a region around line B-B' at a lower, left corner of the layout 200B in FIG. 2B, and FIG. 7B is a cross-section view of the memory device 700 taken along line B-B' in FIG. 6B, in accordance with some embodiments. The configuration and manufacture of the memory device 700 are described herein with respect to FIGS. 6A-6B and FIGS. 7A-7B.

The memory device 700 comprises a substrate 701, for example, as illustrated in FIGS. 7A-7B. The substrate 701 comprises, in at least one embodiment, a silicon substrate. The substrate 701 comprises, in at least one embodiment, silicon germanium (SiGe), Gallium arsenic, or other suitable semiconductor materials. Active area regions are formed in or over the substrate 701 as described with respect to FIGS. 2, 2A, 2B, 3, 4 and 5. In at least one embodiment, shallow trench isolation (STI) regions are formed in the substrate 701 for isolating the active area regions. Example materials of the STI regions include, but are not limited to, silicon oxide, silicon nitride, silicon oxynitride, fluoride-doped silicate, and/or any other low k dielectric materials. For simplicity, the STI regions are not illustrated. In some embodiments, the substrate 701 further includes one or more other features, such as various doped regions, a buried layer, and/or an epitaxy (epi) layer. In some embodiments, the substrate 701 comprises a semiconductor on insulator, such as silicon on insulator (SOI). In some embodiments, the substrate 701 includes a doped epi layer, a gradient semiconductor layer, and/or a semiconductor layer overlying another semiconductor layer of a different type such as a silicon layer on a silicon germanium layer.

The memory device 700 further comprises gate electrodes over the substrate 701. For example, as shown in FIG. 7A, gate electrodes 212, 213, 214 and a gate electrode 711 not shown in FIG. 6A are over the substrate 701. The gate electrodes are schematically illustrated in the drawings with the label "MG." In some embodiments, the memory device 700 further comprises a gate dielectric between a corresponding gate electrode and the substrate 701. Example materials of the gate dielectric include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. The thickness of the high-k dielectric layer is in the range of, for instance, about 5-about 40 Å. In some embodiments, the gate dielectric is formed over the substrate 701 by atomic layer deposition (ALD) or other suitable techniques.

A conductive material of the gate electrode is formed over the gate dielectrics. In at least one embodiment, the gate electrodes is formed of poly-silicon or metal. In one or more embodiments, the gate electrode comprises Al, AlTi, Ti, TiN, TaN, Ta, TaC, TaSiN, W, WN, MoN, and/or other suitable conductive materials. A thickness of the gate electrode ranges, for instance, from about 10 to about 200 Å. In some embodiments, the gate electrode is formed by chemical vapor deposition (CVD), physical vapor deposition (PVD or sputtering), plating, atomic layer deposition (ALD), and/or other suitable processes.

In one or more embodiments, the memory device 700 further comprises a hard mask over a corresponding gate electrode. For example, as shown in FIG. 7A, hard masks 721, 722 are over the corresponding gate electrodes 711, 212. In at least one embodiment, further hard masks are formed over the corresponding gate electrodes 213, 214, and are removed during one or more subsequent processes as described herein. The hard masks are schematically illustrated in the drawings with the label "HM." Example materials of the hard masks include, but are not limited to, silicon nitride, silicon oxynitride, silicon carbide and other suitable materials. The hard masks are formed, in at least one embodiment, by a deposition process or any suitable methods, and used as a mask to pattern the corresponding gate electrode.

In one or more embodiments, the memory device 700 further comprises spacers over sidewalls of the corresponding gate electrode. For example, as shown in FIG. 7A, spacers 731-732 are over sidewalls of the gate electrode 711, spacers 733-734 are over sidewalls of the gate electrode 212, spacers 735-736 are over sidewalls of the gate electrode 213, and spacers 737-738 are over sidewalls of the gate electrode 214. In some embodiments, parts of the spacers 735, 736, 737, 738 are removed during one or more subsequent processes as described herein. The spacers comprise, for instance, a dielectric layer. Example materials of the spacer include, but are not limited to, silicon nitride, oxynitride, silicon carbide and other suitable materials. In some embodiments, the spacers contain impurity, such as boron, carbon, fluorine, or combinations thereof. In some embodiments, the spacers are formed by suitable methods. For example, a layer of a material for the spacers is deposited over the gate electrodes and the substrate 701, for example, by plasma enhanced chemical vapor deposition (PECVD), low-pressure chemical vapor deposition (LPCVD), sub-atmospheric chemical vapor deposition (SACVD), atomic layer deposition (ALD), and the like. The layer for of the material for the spacers is formed to have a suitable thickness, e.g., in the range of about 50 Å to about 400 Å. Further, the deposited layer is patterned to form the spacers in contact or adjacent to the sidewalls of the corresponding gate electrodes. The patterning is performed, in at least one embodiment, by suitable techniques, such as a wet etch process, a dry etch process, or combinations thereof. In one or more embodiments, the patterning to form the spacers is conducted by an anisotropic dry etching process. The above description where the gate electrodes is formed before the spacers is referred to as a gate-first process. In an alternative, gate-last process, the same or similar steps of the gate-first process is performed to form a dummy gate, e.g., dummy poly-silicon, and the spacers. The dummy gate is replaced afterwards with a suitable metal or conductive material to obtain the gate electrodes.

The memory device 700 further comprises source/drain regions in the active area region of the substrate 701. For example, source/drain regions in the active area regions 206, 207 are illustrated in FIG. 7B. In at least one embodiment, the source/drain regions are formed by using the gate electrodes and the spacers as a mask. For example, the formation of the source/drain regions is performed by an ion implantation or a diffusion process. Depending on the type of the devices or transistors, the source/drain regions are doped with p-type dopants, such as boron or $BF_2$, n-type dopants, such as phosphorus or arsenic, and/or combinations thereof. In some embodiments, lightly doped source/drain (LDD) regions are formed in the substrate 701 prior to the formation of the spacers, by one or more implantation processes, such as an ion implantation process.

In one or more embodiments, the memory device 700 further comprises an inter-layer dielectric (ILD) layer 740 over the substrate 701, for example, as illustrated in FIGS. 7A-7B. The ILD layer 740 is also referred to herein as an ILD0 layer and is schematically illustrated in the drawings with the label "ILD0." Example materials of the ILD0 layer 740 include, but are not limited to, SiNx, SiOx, SiON, SiC, SiBN, SiCBN, or combinations thereof. In at least one embodiment, the ILD0 layer 740 is formed using high-density plasma (HDP), although other methods such as Sub-Atmospheric Pressure Chemical Vapor Deposition (SACVD), Lower Pressure Chemical Vapor Deposition (LP-CVD), ALD, Plasma enhanced ALD (PEALD), Plasma enhanced CVD (PECVD), Monolayer Deposition (MLD), Plasma Impulse CVD (PICVD), spin-on, or the like are used in various embodiments.

In one or more embodiments, the memory device 700 further comprises a contact etch stop layer (CESL) 741 over sidewalls of the spacers 731-738, for example, as illustrated in FIG. 7A. The CESL 741 is schematically illustrated in the drawings with the label "CESL." Example materials of the CESL 741 include, but are not limited to, AlxOy, SixNy, SixOy, SixNyOz, SiC, SiCN, BN, SiBN, SiCBN, or combinations thereof. In some embodiments, the CESL 741 is deposited by an ALD, CVD, PVD, or sputtering process.

In one or more embodiments, a planarizing process is performed to expose the hard masks 721, 722. The planarizing process comprises, for example, a chemical mechanical polish (CMP) process. In some embodiments, the hard masks 721, 722 are removed by the planarizing process or another etching and/or CMP process to expose the underlying gate electrodes. In some embodiments, the gate electrodes are removed and replaced with replacement gate electrodes, such as metal gates, in a gate-last process as described herein.

In one or more embodiments, a further ILD layer, referred to herein as an ILD1 layer, is formed over the planarized ILD0 layer 740. The ILD1 layer is not illustrated in FIGS. 7A-7B. Contact openings are formed in the ILD1 layer and the ILD0 layer 740 by an etching process to expose the source/drain regions and/or the gate electrodes. At least one conductive material is filled in the contact openings.

The conductive material filled in the contact openings over the source/drain regions becomes S/D contacts or contact areas, for example, contact areas BL, BLB, VCC, VSS, MT, MB described with respect to FIGS. 2A, 2B, 3 and 4. A contact area MT 642 is illustrated in FIGS. 6B and 7B. The contact area MT 642 is a storage node connecting the corresponding source/drain regions in the active area regions 206, 207 as best seen in FIG. 7B. The S/D contacts or contact areas BL, BLB, VCC, VSS, MT, MB are conductive patterns in the MD1 layer, as illustrated in FIG. 7B.

The conductive material filled in the contact openings over the gate electrodes becomes gate contacts or buried contacts, for example, buried contacts 361, 362, 363, 364 described with respect to FIG. 3 and/or buried contacts 221, 222, 223, 224, 225 described with respect to FIGS. 2A, 2B and 4. The buried contacts 221, 222 are illustrated in FIG. 7A, and the buried contact 221 is illustrated in FIG. 7B. In at least one embodiment, the formation of the contact openings for the buried contacts 221, 222 removes the hard masks over the gate electrodes 213, 214 and a portion of the spacers 735, 736, 737, 738. As a result, the buried contacts 221, 222 are formed over not only the top surfaces, but also side surfaces of the corresponding gate electrodes 213, 214, as illustrated in FIG. 7A. In the example configuration in FIG. 7A, the buried contacts 221, 222 have top portions 751, 752 extending laterally away from each other. The described configuration of the buried contacts 221, 222 is an example. Other configurations are within the scope of various embodiments. In at least one embodiment, the buried contacts or gate contacts are formed in one or more common processes together with the S/D contacts. In at least one embodiment, the buried contacts (i.e., gate contacts) are formed in one or more common processes together with the S/D contacts. In at least one embodiment, the buried contacts (i.e., gate contacts) are formed in one or more processes separate from those for forming the S/D contacts. The buried contacts are conductive patterns in the MD1 layer.

In at least one embodiment, before forming the buried contacts and/or the S/D contacts, a silicidation (e.g., self-aligned silicidation) process or a suitable method is performed to provide the top surfaces of the source/drain regions and/or the gate electrodes with silicided regions as contact features. For example, a metal layer is blanket-deposited over the exposed source/drain regions and/or exposed gate electrodes, and then an annealing step is performed to form metal silicide layers on the source/drain regions and/or the gate electrodes. Un-reacted metal is subsequently removed, e.g., by a wet chemical etch.

In at least one embodiment, a planarizing process is performed to planarized the MD1 layer, resulting in flush top surfaces of the buried contacts and the S/D contacts. For example, as illustrated in FIG. 7B, the top surfaces of the buried contact 221 and the S/D contact MT 642 are flush. The gate electrodes, e.g., 711, 212, 213, 214, the gate contacts, e.g., 221, 222, and the S/D contacts, e.g., 642, are arranged in the ILD0 layer 740.

In at least one embodiment, the memory device 700 further comprises a CESL layer over the planarized MD1 layer. The further CESL layer is designated as 753 in FIG. 7A. In at least one embodiment, the memory device 700 comprises a further ILD layer, referred to herein as an ILD2 layer, over the CESL layer 753. The ILD2 layer is designated as 754 in FIG. 7A, and is schematically illustrated in the drawing with the label "ILD2." In at least one embodiment, a plurality of openings is formed in the ILD2 layer 754 and the CESL layer 753 in regions where conductive patterns of the MD2 layer are to be formed.

The memory device 700 further comprises a dielectric layer 760 deposited over the substrate 701 to line sidewalls and bottoms of the openings. In the example configuration in FIG. 7A, the dielectric layer 760 includes portions 761, 762 lining sidewalls of an opening in which the conductive pattern 235 of the MD2 layer is to be formed. The dielectric layer 760 further includes a portion 763 lining a bottom of the opening. In some embodiments, the dielectric layer 760 is deposited by an ALD process. An example material of the dielectric layer 760 includes, but is not limited to, silicon nitride. The dielectric layer 760 is schematically designated as "SiN" in FIGS. 7A-7B.

The dielectric layer 760 is selectively removed, e.g., by a photolithography process followed by an etching process, from the bottoms of the openings where the MD2 layer is to be electrically coupled to the underlying MD1 layer. For example, the dielectric layer 760 is removed from the SNR regions 241, 242, 243, 244, 245, described with respect to FIG. 2A, to expose the underlying conductive patterns of the MD1 layer. In regions outside the SNR regions 241, 242, 243, 244, 245, the dielectric layer 760 is not removed. In the example configuration in FIGS. 7A-7B, the dielectric layer 760 remains over the buried contacts 221, 222.

The memory device 700 further comprises an MD2 layer over the dielectric layer 760. In at least one embodiment, a conductive layer is formed over the dielectric layer 760 to form the MD2 layer, for example, the word lines 231, 232 and the conductive pattern 235 as illustrated in FIGS. 7A-7B. In some embodiments, the MD1 layer and the MD2 layer comprise different conductive materials. In some embodiments, the MD1 layer and the MD2 layer comprise the same conductive material. In some embodiments, the formation of at least one of the MD1 layer or MD2 layer includes depositing a glue (or seed) metal layer underlying the corresponding conductive material(s).

In regions where the dielectric layer 760 is not removed, the MD2 layer is electrically isolated from the underlying MD1 layer. For example, as illustrated in FIG. 7A, the word lines 231, 232 of the MD2 layer are electrically isolated from the corresponding, underlying buried contacts 221, 222 by the remaining dielectric layer 760. As illustrated in FIG. 7B, the word line 231 of the MD2 layer extends over the underlying contact area MT 642 of the MD1 layer, while being electrically isolated from the contact area MT 642 by the remaining layer 760.

In regions where the dielectric layer 760 is removed, the MD2 layer is electrically coupled to the underlying MD1 layer. For example, while it is illustrated in FIG. 7A that the portion 763 of the dielectric layer 760 remains under the conductive pattern 235 of the MD2 layer, the portion 763 is removed in a region (best seen in FIG. 6A) where the conductive pattern 235 of the MD2 layer and a underlying conductive pattern 635 of the MD1 layer overlap each other. As a result, the conductive pattern 235 of the MD2 layer and the underlying conductive pattern 635 of the MD1 layer are electrically coupled to each other.

The described process for forming overlapping conductive patterns of the MD1 and MD2 layers to be electrically coupled in some regions and electrically isolated in other regions is an example. Other arrangements are within the scope of various embodiments. For example, in some embodiments, overlapping conductive patterns of the MD1 and MD2 layers are formed to be electrically coupled in some regions and electrically isolated in other regions in accordance with one or more methods described in U.S. non-provisional application Ser. No. 14/484,670, filed Sep. 12, 1014, which is incorporated by reference herein in its entirety.

In at least one embodiment, a planarizing process is performed to planarized the MD2 layer, resulting in flush top surfaces of the conductive patterns of the MD2 layer. For example, as illustrated in FIG. 7A, the top surfaces of the word lines 231, 232 and the top surface of the conductive pattern 235 are flush.

In at least one embodiment, the memory device 700 comprises a further ILD layer, referred to herein as an ILD3 layer, over the planarized MD2 layer. The ILD3 layer is designated as 770 and is schematically illustrated with the label "ILD3" in FIGS. 7A-7B.

In at least one embodiment, a plurality of openings is formed at least in the ILD3 layer 770 in regions where V0 vias of the V0 layer are to be formed, and at least one conductive material is filled in the openings to obtain the V0 vias. The memory device 700 comprises V0 vias which electrically couple the word lines to the corresponding buried contacts, and which are schematically illustrated with the label "V0_MG" in FIGS. 6A-6B and 7A-7B. The memory device 700 further comprises V0 vias which are electrically coupled to conductive patterns of the MD2 layer, and which are schematically illustrated with the label "V0_MD" in FIGS. 6A-6B and 7A-7B. In at least one embodiment, the V0_MG vias are formed by a mask different from a mask for forming the V0_MD vias. Other arrangements are within the scope of various embodiments.

In the example configuration in FIG. 7A, a V0_MD via 256 is filled in an opening formed in the ILD3 layer 770, and is electrically coupled to the underlying conductive pattern 235. A conductive pattern 261 of the MD1 layer is over and electrically coupled to the V0_MD via 256.

In the example configuration in FIG. 7A, V0_MG vias 251, 252 are filled in openings formed through the ILD3 layer 770, the ILD2 layer 754, and the CESL layer 753. The openings for the V0_MG vias 251, 252 expose top surfaces of the corresponding buried contacts and word lines. For example, the top surface 772 of the word line 232 and the top surface 774 of the buried contact 222 are exposed in the opening for forming the V0_MG via 252. In at least one embodiment, during formation of the opening for a V0_MG via, a portion of the dielectric layer 760 and/or a portion of the word line exposed in the opening is/are removed partially or wholly. For example, in one or more embodiments, a portion 764 of the dielectric layer 760 and/or a portion 765 of the word line 232 exposed in the opening for the V0_MG via 252 is/are removed partially or wholly, resulting in the V0_MG via 252 having, at a lower portion 766, a sidewall 767 in physical and electrical contact with a side face of the word line 232. In some embodiments where the portion 765 of the word line 232 is not completely removed, an upper portion 768 of the V0_MG via 252 is in electrical contact with the top surface 772 of the word line 232 as shown in a region 769 in FIG. 7A. The lower portion 766 of the V0_MG via 252 and the word line 232 are at least partially co-elevational with each other, and are arranged in the ILD2 layer 754. The lower portion 766 of the V0_MG via 252 is continuous to the upper portion 768 which is arranged in the ILD3 layer 770. The lower portion 766 of the V0_MG via 252 is in electrical contact with the top surface 774 of the buried contact 222. As a result, the word line 232 and the buried contact 222 are electrically coupled to each other from above by the V0_MG via 252. The word line 231 and the buried contact 221 are electrically coupled to each other from above by the V0_MG via 251 in a similar configuration.

As discussed herein, in some embodiments, by forming the word lines in the MD2 layer, various limitations on conductive patterns of the M1 layer and vias of the V0 layer are relaxed. As a result, limitations on the location and/or size of the V0_MG vias 251, 252 are also relaxed. In at least one embodiment, it is possible to adjust the location and/or size of the V0_MG vias 251, 252 to increase the overlapping areas between the V0_MG vias 251, 252 and the corresponding, underlying word lines 231, 232, for example, in the region 769 in FIG. 7A. The increased overlapping areas reduce contact resistance between the V0_MG vias 251, 252 and the corresponding, underlying word lines 231, 232, and improve performance and or power consumption of the memory device 700, in one or more embodiments.

In some embodiments, the described configuration of a via (e.g., V0_MG via 252) formed over and electrically coupling a conductive pattern of an upper conductive layer (e.g., the MD2 layer) to a conductive pattern of a lower conductive layer (e.g., the MD1 layer) is applicable not only to memory devices (e.g., the memory device 700), but also other types of semiconductor devices, which in one or more embodiments do not include memory cells.

Figure 8:
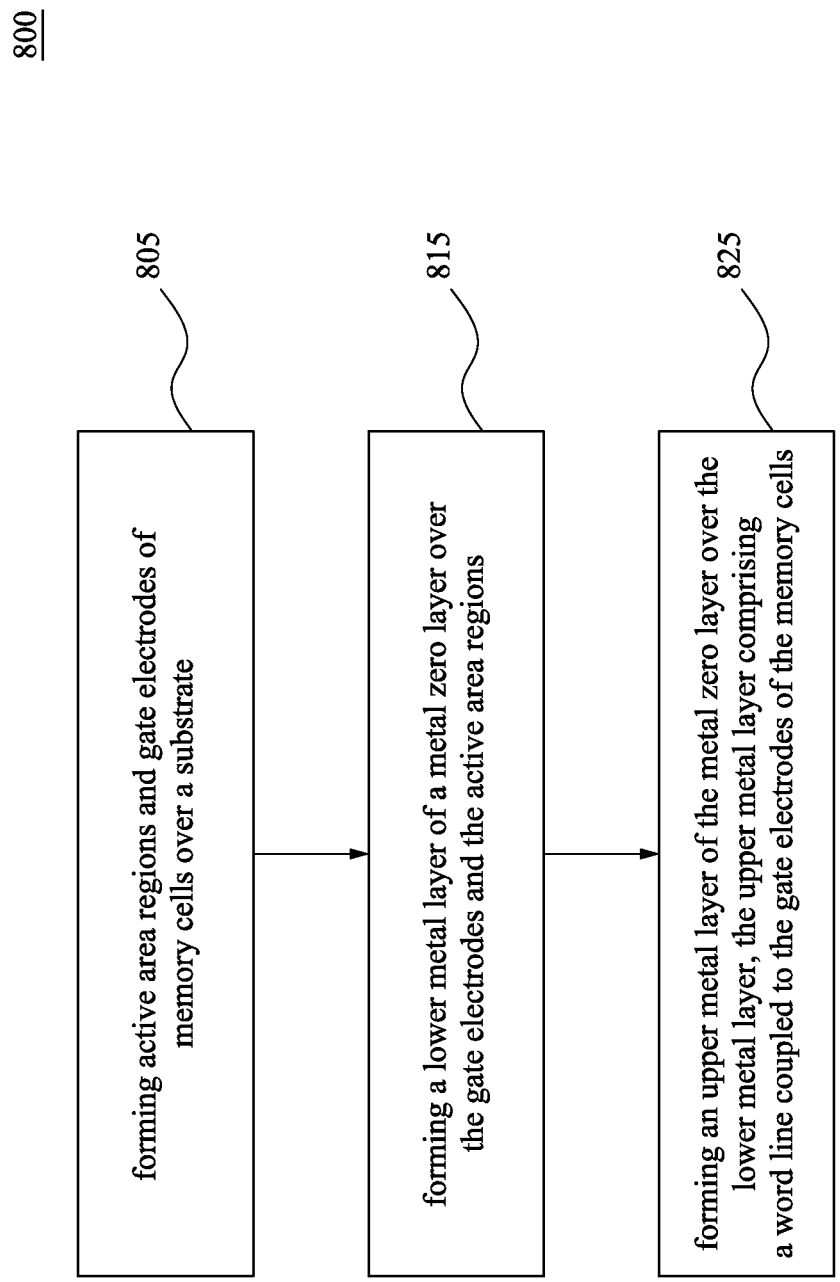
FIG. 8 is a flow chart of a method of manufacturing a memory device, in accordance with some embodiments.

FIG. 8 is a flow chart of a method 800 of manufacturing a memory device, in accordance with some embodiments.

At operation 805, active area regions and gate electrodes of memory cells of the memory device are formed over a substrate. For example, in one or more embodiments, active area regions 206-209 and gate electrodes 212-215 of various memory cells Cell 1-1, Cell 1-2, Cell 2-1, Cell 2-2, are formed over a substrate 701, as described with respect to FIGS. 2, 2A, 2B, 4, 6A-6B and 7A-7B.

At operation 815, a lower metal layer of a metal zero layer is formed over the gate electrodes and the active area regions. For example, in one or more embodiments, an MD 1 layer of a M0 layer is formed over the active area regions 206-209 and the gate electrodes 212-215, as described with respect to FIGS. 2, 2A, 2B, 4, 6A-6B and 7A-7B. The MD1 layer includes gate contacts, such as 221-225, over the corresponding gate electrodes, and S/D contacts, such as BL, BLB, VCC, VSS, MT, MB, over the corresponding active area regions.

At operation 825, an upper metal layer of the metal zero layer is formed over the lower metal layer, and comprises a word line coupled to the gate electrodes of the memory cells. For example, in one or more embodiments, an MD2 layer of the M0 layer is formed over the MD1 layer. The MD2 layer comprises a word line, such as 231, coupled to the gate electrodes of the memory cells Cell 1-1, Cell 2-1, as described with respect to FIGS. 2, 2A, 2B, 4, 6A-6B and 7A-7B. The word line, such as 231, flies over, but remains electrically isolated from, underlying S/D contacts, such as MT, as described with respect to FIG. 7B. In at least one embodiment, the word line 231 in the MD2 layer is coupled to a corresponding gate electrode by way of the corresponding, underlying gate contact, such as 221, and an overlying V0 via, such as 251, as described with respect to FIG. 7A.

The above method(s) include(s) example operations, but the operations in some embodiments are not performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Some embodiments provide a memory device having word lines in an MD2 layer of a M0 layer. As a result, in one or more embodiments, a density of conductive patterns in one or more upper metal layers, such as the M1 layer, is reduced which, in turn, permits one or more process windows to be met. Compared to some other approaches, by adding one more mask for forming the word lines in the MD2 layer in at least one embodiment, process windows, such as MD2 E-E process window, MD2 EN V0 process window, and M1 Min pitch process window, are met. In some embodiments, the interconnection between an MD2 conductive pattern and a underlying MD1 layer conductive pattern is implemented by a V0 via which overlaps and electrically couples the corresponding MD2 and MD1 conductive patterns. As a result, in some embodiments, one or more of manufacturing time, manufacturing cost, manufacturing material, and chip size is/are reduced compared to some other approaches.

In some embodiments, a layout of a memory device is stored on a non-transitory computer-readable medium. The layout comprises a plurality of active area regions, a lowermost interconnect layer, a plurality of memory cells, and a word line. The lowermost interconnect layer comprises a first conductive layer over the plurality of active area regions, and a second conductive layer over the first conductive layer. The plurality of memory cells comprises the plurality of active area regions. The word line is in the second conductive layer, and is coupled to the plurality of memory cells.

In some embodiments, a semiconductor device comprises a substrate, a gate electrode over the substrate, a first conductive layer over the substrate, a dielectric layer over the first conductive layer, a second conductive layer over the dielectric layer, and a via. The first conductive layer comprises a gate contact over and coupled to the gate electrode. The second conductive layer comprises a conductive pattern over the gate contact. The via is over both the conductive pattern and the gate contact, and couples the conductive pattern to the gate contact.

In a method of manufacturing a memory device in accordance with some embodiments, active area regions and gate electrodes of a plurality of memory cells of the memory device are formed over a substrate. A lower metal layer of a metal zero layer is formed over the gate electrodes and the active area regions. An upper metal layer of the metal zero layer is formed over the lower metal layer. The upper metal layer comprises a word line coupled to the gate electrodes of the plurality of memory cells.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A layout of a memory device, the layout stored on a non-transitory computer-readable medium and comprising:
 a plurality of active area regions;

a lowermost interconnect layer, comprising:
  a first conductive layer over the plurality of active area regions, and
  a second conductive layer over the first conductive layer;
a plurality of memory cells comprising the plurality of active area regions; and
a word line in the second conductive layer, the word line coupled to the plurality of memory cells, wherein the word line is under a lowermost surface of a lowermost via layer.

2. The layout of claim 1, wherein
the word line extends continuously across the plurality of memory cells.

3. The layout of claim 1, further comprising:
a dielectric layer interposed between the first conductive layer and the second conductive layer in a first region of the lowermost interconnect layer,
wherein
the dielectric layer is absent between the first conductive layer and the second conductive layer in a second region of the lowermost interconnect layer, and
the first conductive layer is coupled to the second conductive layer in the second region of the lowermost interconnect layer.

4. The layout of claim 1, wherein
the plurality of memory cells comprises a plurality of storage nodes in the first conductive layer,
the word line in the second conductive layer extends over the plurality of storage nodes in the first conductive layer, and
the layout further comprises a dielectric layer interposed between the word line and the plurality of storage nodes.

5. The layout of claim 4, wherein
the first conductive layer further comprises, in addition to the plurality of storage nodes, first conductive patterns over the plurality of active area regions,
the second conductive layer further comprises, in addition to the word line, second conductive patterns over and coupled to the corresponding first conductive patterns.

6. The layout of claim 5, further comprising:
a plurality of bit lines extending over and coupled to the corresponding second conductive patterns.

7. The layout of claim 1, further comprising:
a gate electrode over and across the plurality of active area regions, the gate electrode extending along, without overlapping, the word line.

8. The layout of claim 7, further comprising:
a gate contact over the gate electrode,
wherein the lowermost via layer comprises a via over both the word line and the gate contact, the via coupling the word line to the gate contact.

9. The layout of claim 8, wherein
the word line extends over the gate contact, and
the layout further comprises a dielectric layer interposed between the word line and the gate contact.

10. A semiconductor device, comprising:
a substrate;
a gate electrode over the substrate;
a first conductive layer over the substrate, the first conductive layer comprising a gate contact over and coupled to the gate electrode;
a dielectric layer over the first conductive layer;
a second conductive layer over the dielectric layer, the second conductive layer comprising a conductive pattern over the gate contact; and
a via having a lowermost surface over both the conductive pattern and the gate contact, the via coupling the conductive pattern to the gate contact.

11. The semiconductor device of claim 10, further comprising:
a plurality of memory cells,
wherein the conductive pattern in the second conductive layer comprises a word line coupled to the plurality of memory cells.

12. The semiconductor device of claim 11, wherein
a memory cell among the plurality of memory cells comprises the gate electrode, and
the via and the gate contact couple the gate electrode of the memory cell to the word line.

13. The semiconductor device of claim 12, wherein
the plurality of memory cells comprises a plurality of storage nodes in the first conductive layer,
the word line in the second conductive layer extends over the plurality of storage nodes in the first conductive layer, and
the dielectric layer is interposed between the word line and the plurality of storage nodes.

14. The semiconductor device of claim 13, wherein
the plurality of memory cells further comprises a plurality of active area regions over the substrate,
the first conductive layer further comprises, in addition to the plurality of storage nodes and the gate contact, first conductive patterns over the plurality of active area regions, and
the second conductive layer further comprises, in addition to the word line, second conductive patterns over and coupled to the corresponding first conductive patterns, without the dielectric layer interposed between the second conductive patterns over and the corresponding first conductive patterns.

15. The semiconductor device of claim 10, wherein the via comprises:
an upper portion over and in contact with an upper surface of the conductive pattern in the second conductive layer, and
a lower portion continuous to the upper portion, the lower portion over and in contact with an upper surface of the gate contact in the first conductive layer.

16. The semiconductor device of claim 10, wherein the via comprises a portion at least partially co-elevational with the conductive pattern in the second conductive layer, said portion in contact with a side face of the conductive pattern.

17. The semiconductor device of claim 15, further comprising:
a first inter-layer dielectric (ILD) layer over the substrate, wherein the gate electrode and the first conductive layer are arranged in the first ILD layer;
a second ILD layer over the first ILD layer, wherein the second conductive layer and the lower portion of the via is arranged in the second ILD layer; and
a third ILD layer over the second ILD layer, wherein the upper portion of the via is arranged in the third ILD layer.

18. A semiconductor device, comprising:
a gate electrode over a substrate;
a first conductive layer over the substrate, the first conductive layer comprising a gate contact coupled to the gate electrode;
a dielectric layer over the first conductive layer;
a second conductive layer over the dielectric layer, the second conductive layer comprising a conductive pattern over the gate contact;

a via having a lowermost surface over the conductive pattern, the via arranged to couple the conductive pattern to the gate contact; and a plurality of memory cells, wherein the conductive pattern comprises a word line coupled to the plurality of memory cells.

19. The semiconductor device of claim 18, wherein the via comprises:

a first portion in contact with and over an upper surface of the conductive pattern in the second conductive layer, and a second portion in contact with and over an upper surface of the gate contact in the first conductive layer.

20. The semiconductor device of claim 19, further comprising:

a first inter-layer dielectric (ILD) layer over the substrate, wherein the gate electrode and the first conductive layer are within the first ILD layer;

a second ILD layer over the first ILD layer, wherein the second conductive layer and the second portion of the via are within the second ILD layer; and a third ILD layer over the second ILD layer, wherein the first portion of the via is positioned in the third ILD layer.

* * * * *